US012713542B2

(12) United States Patent
Tada et al.

(10) Patent No.: US 12,713,542 B2
(45) Date of Patent: Aug. 18, 2026

(54) DAMPER, ELECTRONIC CONTROLLER, AND METHOD FOR COUPLING DAMPER

(71) Applicant: DENSO CORPORATION, Kariya-city (JP)

(72) Inventors: Shingo Tada, Kariya-city (JP); Minoru Hozuka, Kariya-city (JP); Takahiro Kurioka, Kariya-city (JP); Kazunori Yoshida, Kariya-city (JP); Ryoichi Shinoda, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 1051 days.

(21) Appl. No.: 17/524,795

(22) Filed: Nov. 12, 2021

(65) Prior Publication Data

US 2022/0210932 A1 Jun. 30, 2022

(30) Foreign Application Priority Data

Dec. 24, 2020 (JP) ................................ 2020-215320

(51) Int. Cl.
*H05K 5/02* (2006.01)
*F16F 1/02* (2006.01)
*F16F 15/06* (2006.01)

(52) U.S. Cl.
CPC ........... *H05K 5/0217* (2013.01); *F16F 1/028* (2013.01); *F16F 15/06* (2013.01); *F16F 2224/0208* (2013.01); *F16F 2224/0258* (2013.01); *F16F 2226/042* (2013.01);
(Continued)

(58) Field of Classification Search
CPC .. H05K 5/02; F16F 1/028; F16F 15/06; F16F 2226/042; F16F 2234/02; F16F 2224/0258; F16F 2230/0005; F16F 2230/02; F16F 2224/0208; F16F 15/04; F16F 1/36; F16F 15/08
USPC ....... 248/615, 618, 626, 627, 630, 632, 634, 248/560, 575, 580, 599, 600, 601, 602
See application file for complete search history.

(56) References Cited

U.S. PATENT DOCUMENTS 4,306,708 A * 12/1981 Gassaway ................ F24F 1/10 248/635
4,879,123 A * 11/1989 Siebrecht .............. A22C 13/00 426/135

(Continued)

FOREIGN PATENT DOCUMENTS

CN 211931117 U 11/2020
DE 8212246 U1 8/1982

(Continued)

OTHER PUBLICATIONS

U.S. Appl. No. 17/524,915, filed Nov. 12, 2021, Tada et al.

*Primary Examiner* — Terrell L Mckinnon
(74) *Attorney, Agent, or Firm* — Posz Law Group, PLC

(57) ABSTRACT

A damper is disposed in a holding hole that passes through, in a passing-through direction, a supported member that is supported by a supporting member. The damper includes a tubular body defining therein a through hole extending in the passing-through direction. The tubular body is elastically deformable between a first form and a second form. The tubular body in the first form has an outer shape that is smaller than the holding hole. The tubular body in the second form has an outer shape that is equal to or greater than the holding hole.

18 Claims, 14 Drawing Sheets

(52) U.S. Cl.
CPC ... *F16F 2230/0005* (2013.01); *F16F 2230/02* (2013.01); *F16F 2234/02* (2013.01)

(56) References Cited

U.S. PATENT DOCUMENTS 4,884,656 A * 12/1989 Baheti ................... F16F 1/3835 181/207
5,014,487 A * 5/1991 King .................... A47B 47/027 52/844
5,131,619 A * 7/1992 Daugherty ............ F16F 1/3605
5,335,893 A * 8/1994 Opp ........................ B64C 1/066 403/228
5,788,209 A * 8/1998 Dandre ................... F16F 1/387 248/634
5,959,642 A * 9/1999 Fujioka .................... B41J 19/06 248/635
6,328,513 B1 * 12/2001 Niwa ...................... F16F 1/362 411/339
6,354,558 B1 * 3/2002 Li ......................... F16F 1/3732 248/673
6,668,956 B1 * 12/2003 Pelage ................... B60K 11/04 180/312
7,095,610 B1 * 8/2006 Banko ................... G06F 1/1616 361/679.55
8,235,350 B2 * 8/2012 Tetsuda ................. B60T 8/3685 248/560
8,424,855 B1 4/2013 Verbowski
8,644,028 B2 * 2/2014 Qin ........................ H05K 13/00 361/810
8,684,322 B2 * 4/2014 Park ...................... B05B 15/622 248/245
8,984,817 B2 * 3/2015 Weiden ................... F16C 33/08 52/173.3
9,897,159 B2 * 2/2018 Marble ................. F16F 9/3485
10,309,456 B2 * 6/2019 Muehling ............... F16C 43/02
10,416,729 B2 * 9/2019 Sun ...................... G11B 33/124
10,472,111 B2 * 11/2019 Li ........................... E04F 15/18
10,724,400 B2 * 7/2020 Ac ....................... F16F 15/0237
10,767,696 B2 * 9/2020 Jaeger ................... F16C 33/208
10,882,391 B2 * 1/2021 Noguez .................. B60K 11/04
11,193,544 B2 * 12/2021 Greinwald ............ F16C 17/107
11,286,986 B2 * 3/2022 Dimartino ............... F16C 33/14
11,668,368 B2 * 6/2023 Tada ....................... F16F 1/362 188/381
2003/0173470 A1 * 9/2003 Geiger .................. F16L 55/035 248/55
2008/0169591 A1 7/2008 Kobayashi et al.
2010/0116495 A1 5/2010 Spray
2011/0049834 A1 * 3/2011 Natu ..................... F16C 33/203 29/527.4
2013/0189459 A1 * 7/2013 Davis .................... F16L 59/024 428/34.1
2014/0151528 A1 * 6/2014 Park ....................... F16M 13/02 267/141
2015/0136085 A1 * 5/2015 Rehwald ................ F02M 61/14 248/560
2016/0069112 A1 * 3/2016 Neumark .............. F16C 33/205 16/273
2016/0298720 A1 * 10/2016 Duerre ...................... F16D 3/76
2020/0378443 A1 12/2020 Greinwald et al.
2021/0341030 A1 * 11/2021 Deman ................... F16F 1/377

FOREIGN PATENT DOCUMENTS

DE 202006019979 U1 9/2007
DE 102007036418 A1 4/2008
JP S49-036391 U1 5/1972
JP S53-095475 A 8/1978
JP H02-085040 U1 7/1990
JP H05-321967 A 12/1993
JP 2001-124126 A 5/2001
JP 2012-092854 A 5/2012
JP 2014-095441 A 5/2014
JP 2020-148232 A 9/2020

* cited by examiner (a) PREPARING STEP (b) INSERTING STEP (c) DEFORMING STEP (d) MOUNTING STEP (e) COVERING STEP FIG. 11A
FIG. 11C
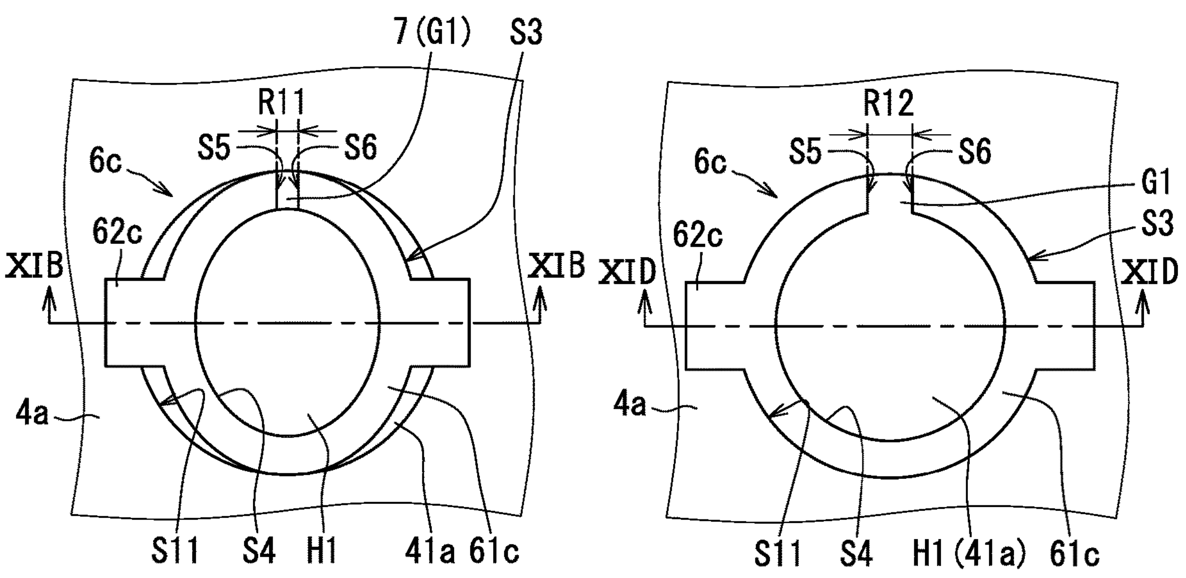
FIG. 11B
FIG. 11D
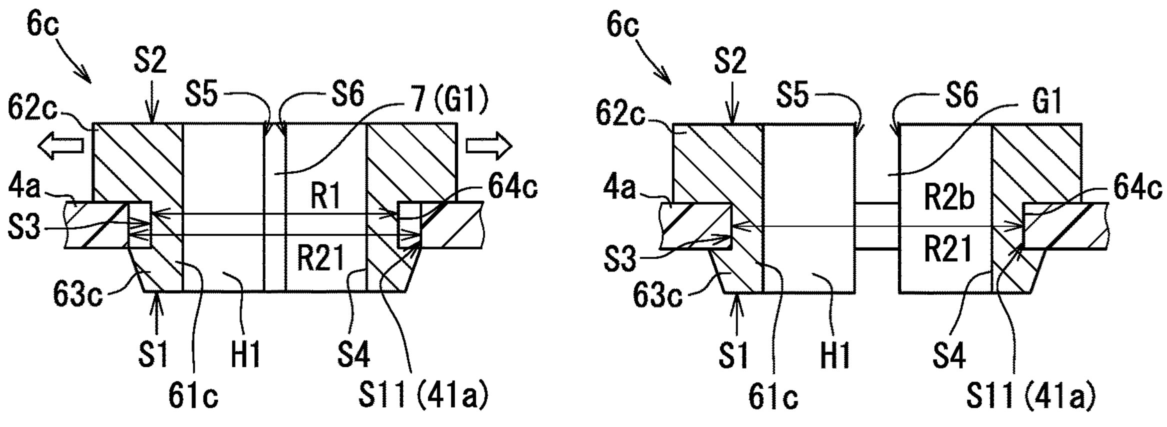

22b
36b
21
201
2b
6d2
6d
1
62d
4a
6d3
34b
23b
6d1
61d
31
3b
41a (S11)
35b
H1

(a) PREPARING STEP (b) ARRANGING STEP (c) INSERTING STEP (d) DEFORMING STEP

DAMPER, ELECTRONIC CONTROLLER, AND METHOD FOR COUPLING DAMPER

CROSS REFERENCE TO RELATED APPLICATION

This application is based on Japanese Patent Application No. 2020-215320 filed on Dec. 24, 2020, the disclosure of which is incorporated herein by reference in its entirety.

TECHNICAL FIELD

The present disclosure relates to a damper, an electronic controller, and a method for coupling the damper.

BACKGROUND ART

An anti-vibration bush, as an example of a damper, absorbs stress transmitted to an electronic device from an attached member.

SUMMARY

A damper is disposed in a holding hole that passes through, in a passing-through direction, a supported member that is supported by a supporting member. The damper includes a tubular body defining a through hole therein extending in the passing-through direction. The tubular body is elastically deformable between a first form and a second form. The tubular body in the first form has an outer shape that is smaller than the holding hole. The tubular body in the second form has an outer shape that is equal to or greater than the holding hole.

An electronic controller in this disclosure includes a supporting member, a damper, a supported member, and a holding member. The damper has a tubular body that is elastically deformable and defines a through hole. The through hole passes through the tubular body between a first end and a second end of the tubular body. The supported member defines a holding hole in which the damper is disposed and is supported by the supporting member through the damper. The holding hole extends along the through hole of the tubular body. The holding member presses the damper toward the supporting member to hold the damper in the supported member. The damper includes an end corner surface. At least one of the supporting member or the holding member includes a tilted surface that is in contact with the end corner surface of the damper, so that the at least one of the supporting member or the holding member is fit to the damper. The damper is in contact with an inner circumferential surface of the holding hole with pressure to hold the supported member.

A method for coupling the damper in this disclosure includes an inserting step of inserting the tubular body in the first form into the holding hole and a deforming step of melting the adhesive with heat to deform the tubular body from the first form to the second form. Thereby, the tubular body is pressed against an inner surface of the holding hole by restoring force

BRIEF DESCRIPTION OF DRAWINGS

FIG. 11A is a diagram illustrating a schematic configuration of a damper in a first form of a third modification.

FIG. 11B is a cross-sectional view taken along a line XIB-XIB in FIG. 11A.

FIG. 11C is a diagram illustrating a schematic configuration of the damper in a second form of the third modification.

FIG. 11D is a cross-sectional view taken along a line XID-XID in FIG. 11C.

DETAILED DESCRIPTION

Figure 1:
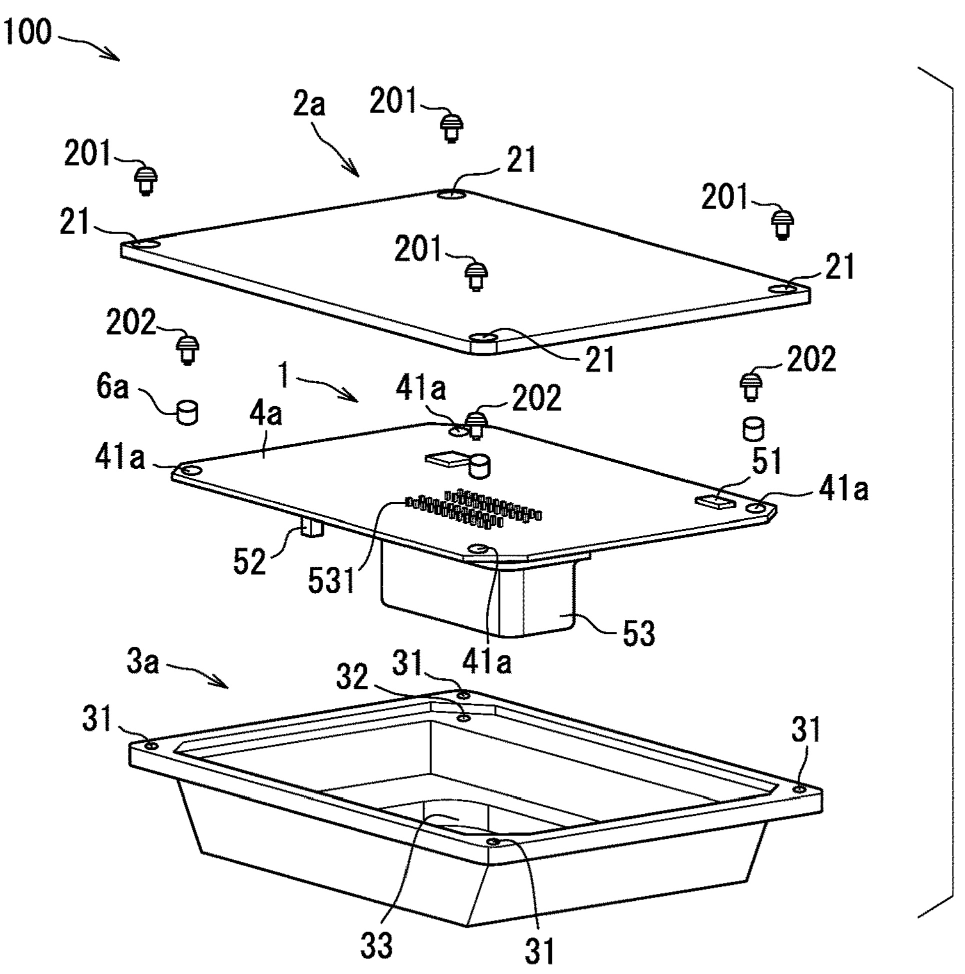
FIG. 1 is a perspective exploded view illustrating a schematic configuration of an electronic controller of a first embodiment.

To begin with, examples of relevant techniques will be described.

As an example of a damper, there is an anti-vibration bush. The anti-vibration bush absorbs stress transmitted to an electronic device from an attached member.

By the way, the electronic device has a bracket defining a hole and the anti-vibration bush is arranged in the hole. However, when the anti-vibration bush is designed to be easily inserted into the hole, a holding force between the anti-vibration bush and the bracket may not be secured.

It is an object of the present disclosure to provide an improved damper, an electronic controller, and a method for coupling the damper. It is another object of the present disclosure to provide a damper that can secure a holding force. It is another object of the present disclosure to provide an electronic controller that can be protected from stress. It is another object of the present disclosure to provide a method for coupling the damper that can simplify a coupling step.

A damper in this disclosure is disposed in a holding hole that passes through, in a passing-through direction, a supported member that is supported by a supporting member. The damper includes a tubular body defining a through hole therein extending in the passing-through direction. The tubular body is elastically deformable between a first form and a second form. The tubular body in the first form has an outer shape that is smaller than the holding hole. The tubular body in the second form has an outer shape that is equal to or greater than the holding hole.

According to this damper, since the tubular body can be in the first form that has the outer shape smaller than the holding hole, the damper can be easily inserted into the holding hole. Further, since the tubular body can be deformed to the second form that has the outer shape equal to or greater than the holding hole, the holding force for the supported member can be secured.

An electronic controller in this disclosure includes the damper, the supporting member, and the supported member. The tubular body in the second form is disposed in the holding hole and presses an inner surface of the holding hole. The supported member is supported by the supporting member through the damper.

The electronic controller includes the damper. Thus, the electronic controller can relax not only stress applied to the supported member in a direction along the through hole but also stress applied to the supported member in an intersecting direction. Therefore, the electronic controller can protect the supported member from stress.

An electronic controller in this disclosure includes a supporting member, a damper, a supported member, and a holding member. The damper has a tubular body that is elastically deformable and defines a through hole. The through hole passes through the tubular body between a first end and a second end of the tubular body. The supported member defines a holding hole in which the damper is disposed and is supported by the supporting member through the damper. The holding hole extends along the through hole of the tubular body. The holding member presses the damper toward the supporting member to hold the damper in the supported member. The damper includes an end corner surface. At least one of the supporting member or the holding member includes a tilted surface that is in contact with the end corner surface of the damper, so that the at least one of the supporting member or the holding member is fit to the damper. The damper is in contact with an inner circumferential surface of the holding hole with pressure to hold the supported member.

In this electronic controller, at least one of the supporting member and the holding member is fit to the damper. Thus, the electronic controller can restrict the damper from being displaced from the at least one of the supporting member and the holding member. Therefore, in the electronic controller, the damper can be appropriately pressed against the inner circumferential surface of the holding hole as compared with the case where the damper is displaced. Thus, the supported member can be protected from stress.

A method for coupling the damper in this disclosure includes an inserting step of inserting the tubular body in the first form into the holding hole and a deforming step of melting the adhesive with heat to deform the tubular body from the first form to the second form. Thereby, the tubular body is pressed against an inner surface of the holding hole by restoring force In this method, since the damper is in the first form during the inserting step, it is easy to insert the damper into the holding hole. Then, since the deforming step is performed after the inserting step, the damper can be easily pressed against the inner surface of the holding hole. Thus, with this method, a coupling step of the damper can be simplified.

The disclosed aspects in this specification adopt different technical solutions from each other in order to achieve their respective objects. The objects, features, and advantages disclosed in this specification will become apparent by referring to following detailed descriptions and accompanying drawings.

Hereinafter, multiple embodiments for implementing the present disclosure will be described with reference to the drawings. In each embodiment, portions corresponding to those described in the preceding embodiment are denoted by the same reference numerals, and redundant descriptions will be omitted in some cases. In each embodiment, when only a part of the configuration is described, the other parts of the configuration can be applied with reference to the preceding embodiments.

First Embodiment

Figure 2:
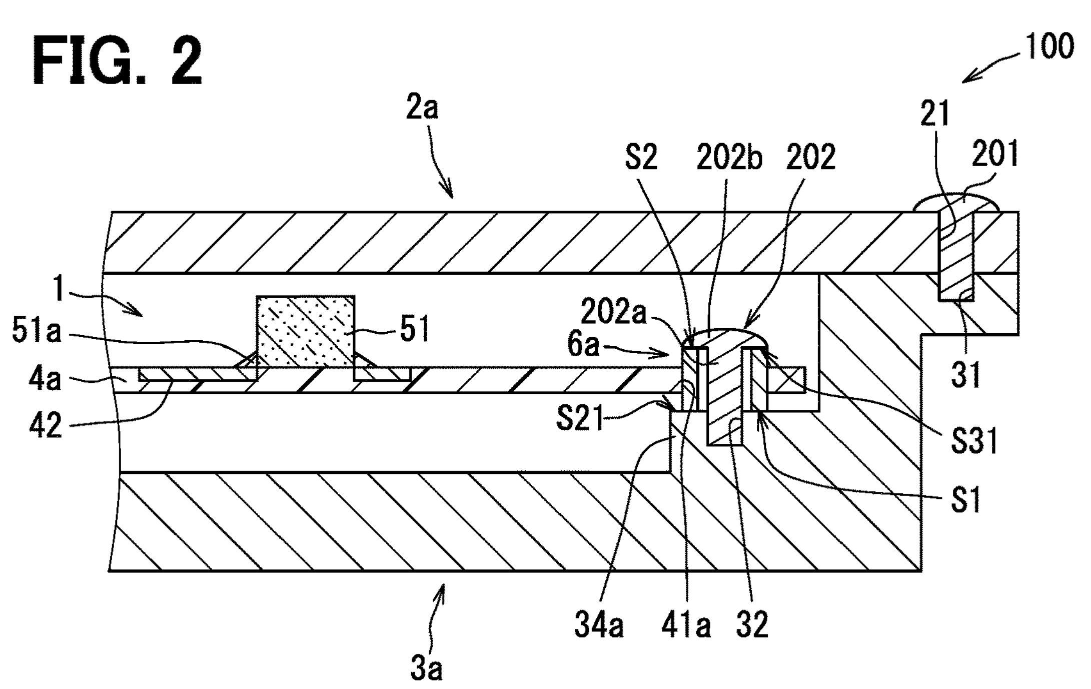
FIG. 2 is a cross-sectional view illustrating a schematic configuration of the electronic controller of the first embodiment.

First, a configuration of an electronic controller 100 will be described with reference to FIGS. 1 to 6. The electronic controller 100 includes a circuit board 1, a cover 2*a*, a base 3*a*, dampers 6*a*, and the like. The electronic controller 100 is configured to be installed in a vehicle, for example. Thus, the electronic controller 100 can be applied to a controller that controls an in-vehicle device. In FIGS. 1 and 2, an illustration of the dampers 6*a* is simplified.

<Circuit Board>

The circuit board 1 corresponds to a supported member. The circuit board 1 includes an insulating substrate 4*a*, circuit elements 51 and 52, a connector 53, and the like. The insulating substrate 4*a* is made of a material such as resin or ceramic and has an electrical insulation property. The insulating substrate 4*a* defines second insertion holes 41*a* that pass through the insulating substrate 4*a* in a thickness direction.

In the following, the thickness direction of the insulating substrate 4*a* is simply referred to as a thickness direction. The thickness direction is the same as a passing-through direction in which a through hole H1 of the damper 6*a*, which will be described later, passes through the damper 6*a*. Further, a direction intersecting the thickness direction corresponds to an intersecting direction. The intersecting direction is a plane direction parallel to a mounting surface of the insulating substrate 4*a* on which the circuit element 51 and the like is mounted.

The insulating substrate 4*a* is provided with a wiring pattern 42 that is a part of a conductive wiring. The wiring pattern 42 is provided on a surface or inside of the insulating substrate 4*a*. The circuit board 1 may be a multi-layer board in which the wiring patterns 42 and the insulating substrates 4*a* are stacked with each other, a single-layer board in which the single-layer wiring pattern 42 is provided on the insulating substrate 4*a*, or the like.

Each of the second insertion holes 41*a* corresponds to a holding hole. The second insertion holes 41*a* are defined, for example, at four corners of the insulating substrate 4*a*. Each of the second insertion holes 41*a* is a hole into which a second screw 202 and the damper 6*a* are inserted. The damper 6*a* is arranged in the second insertion hole 41*a* to be in contact with the second insertion hole 41*a* with pressure. The damper 6*a* will be described in detail later.

Figure 5:
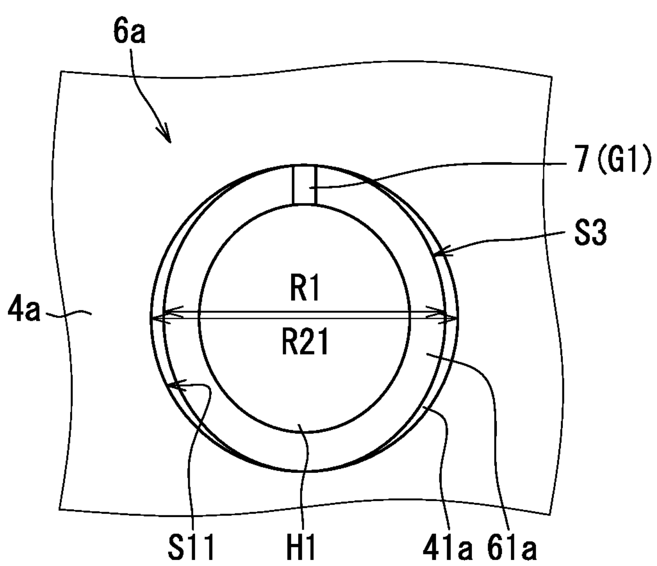
FIG. 5 is a plan view from a direction of an arrow V in FIG. 4.
Figure 6:
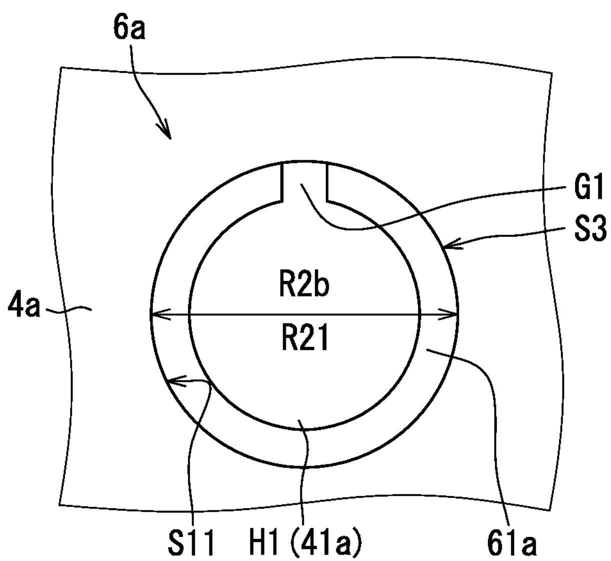
FIG. 6 is a plan view from a direction of an arrow VI in FIG. 4.

Further, as shown in FIGS. 5 and 6, the second insertion hole 41*a* is a through hole surrounded by an annular insertion hole surface S11. The second insertion hole 41*a* is a hole having an inner diameter R21. The insertion hole surface S11 corresponds to an inner surface of the holding hole.

The circuit elements 51 and 52 and the connector 53 correspond to electronic components. The circuit elements 51 and 52 and the connector 53 are mounted on the insulating substrate 4*a*.

Each of the circuit elements 51 and 52 is, for example, a semiconductor switching element, a resistance element, a capacitor, or the like. The circuit element 51 is mounted on a first surface of the insulating substrate 4*a*. On the other hand, the circuit element 52 is mounted on a second surface of the insulating substrate 4*a* that is opposite to the first surface. More specifically, the circuit elements 51 and 52 are mounted on the insulating substrate 4*a* with solder 51*a*. Further, the circuit elements 51 and 52 are electrically connected to the wiring pattern 42 through the solder 51*a*.

The number of the circuit elements 51 and 52 is not limited to that shown in FIG. 1. Further, in the present embodiment, the solder is adopted as an example of a conductive connecting member. However, the conductive connecting member is not limited to solder, and other members such as silver paste can also be adopted. The solder 51*a* and the wiring pattern 42 can be regarded as a connecting portion between the electronic components and the insulating substrate 4*a*.

The connector 53 includes terminals 531 and a connector case that holds the terminals 531. The connector 53 is mounted on the insulating substrate 4*a* while the terminals 531 and the wiring are electrically connected to each other with solder. The connector 53 is provided for electrical connection between the electronic controller 100 and an external device provided outside the electronic controller 100. The external device is another electronic controller, a device to be controlled, or the like. Further, the connector 53 may be, for example, an interface for connecting to a communication line of an in-vehicle network. That is, in this embodiment, the connector 53 is adopted as an example of the interface.

In this embodiment, as an example, the circuit board 1 provided with the connector 53 is adopted. However, the circuit board 1 may not have the connector 53 in the present disclosure.

The circuit board 1 is supported by the base 3*a* with the second screws 202. More specifically, the circuit board 1 is supported by the base 3*a* with the second screws 202 via the dampers 6*a*. Further, the circuit board 1 is supported by the base 3*a* with the multiple second screws 202. In this embodiment, as an example, the circuit board 1 is supported by the base 3*a* with the four second screws 202. Thus, each of the second screws 202 is also referred to as a supporting element.

The second screw 202 may contain a metal as a main component. The second screw 202 has a columnar portion 202*a* with a male thread and a screw head 202*b* located at an end of the columnar portion 202*a*. The columnar portion 202*a* is inserted into the second insertion hole 41*a* and the through hole H1 of the damper 6*a*, and a portion of the columnar portion 202*a* is screwed with the second screw hole 32 (i.e., female thread) defined in the base 3*a*.

The screw head 202*b* has a screw pressing surface S31 that is in contact with an end surface (here, a second surface S2) of the damper 6*a* and that presses the second surface S2. Thus, the screw pressing surface S31 presses the second surface S2 of the damper 6*a* while the second screw 202 is screwed into the second screw hole 32. In other words, the second screw 202 presses the damper 6*a* toward the base 3*a* while the screw pressing surface S31 is in contact with the second surface S2.

In this way, the male threads of the second screws 202 are engaged with the female threads of the second screw holes 32, thereby the circuit board 1 is supported by the base 3*a*. In other words, the circuit board 1 is screwed to the base 3*a* with the second screws 202.

<Housing>

With reference to FIGS. 1 and 2, a housing will be described. The housing accommodates the circuit board 1. The housing includes the cover 2*a* and the base 3*a*. The cover 2*a* and the base 3*a* are assembled to each other to define a housing space for housing the circuit board 1. The cover 2*a* and the base 3*a* are mainly composed of a metal such as aluminum. Thus, the cover 2*a* and the base 3*a* have conductivity.

However, the housing is not limited to this. For example, the cover 2*a* and the base 3*a* may be composed mainly of a resin or the like. Further, only either one of the cover 2*a* and the base 3*a* may be composed of a metal as a main component.

The cover 2*a* is, for example, a plate-shaped member. The cover 2*a* defines first insertion holes 21 passing through the cover 2*a* in the thickness direction. The first insertion holes 21 are defined at the four corners of the cover 2*a*, for example. The first insertion holes 21 are holes into which first screws 201 are inserted.

The base 3*a* corresponds to a supporting member. The base 3*a* is, for example, a box-shaped member having a recess. The base 3*a* defines first screw holes 31, the second screw holes 32, and a connector hole 33. The first screw holes 31 has female threads like the second screw holes 32. The first screw holes 31 are defined at four corners of the base 3*a*, for example. Further, the first screw holes 31 are defined, for example, in a flange of the base 3*a*. Further, the first screw holes 31 are defined in positions to face the first insertion holes 21 when the cover 2*a* and the base 3*a* are arranged to face each other.

The second screw holes 32 are defined in positions of the base 3*a* at which the circuit board 1 is disposed. For example, the second screw holes 32 are defined to face the four corners of the circuit board 1. More specifically, the second screw holes 32 are defined in a pedestal 34*a* of the base 3*a*. The pedestal 34*a* is a protruding portion that is protrude more than a peripheral portion of the pedestal 34*a*. The second screw holes 32 are defined in positions to face the second insertion holes 41*a* when the circuit board 1 is disposed on the pedestal 34*a*. The surface of the pedestal 34*a* is a base pressing surface S21 that is pressed by the damper 6*a*. However, the present disclosure is not limited to this.

The connector hole 33 is a through hole defined in a bottom of the base 3*a*. The connector hole 33 has an opening shape corresponding to an outer shape of the connector 53. The connector 53 is inserted into the connector hole 33 with the circuit board 1 arranged on the pedestal 34*a*. The connector hole 33 is not necessarily defined in the base 3*a*.

The first screw 201 has the same configuration as the second screw 202. The columnar portion of the first screw 201 is inserted into the first insertion hole 21, and a portion of the columnar portion is screwed with the first screw hole 31 defined in the base 3*a*. Thus, the cover 2*a* is fixed to the base 3*a* by engaging the male threads of the first screws 201 and the female threads of the first screw holes 31. Further, in other words, the cover 2*a* is screwed to the base 3*a* with the first screws 201.

The cover 2*a* and the base 3*a* are coupled to each other while the circuit board 1 is supported by the base 3*a*. Further, the cover 2*a* is fixed to the base 3*a* such that the columnar portions of the first screws 20*a* are inserted into the first insertion holes 21 and the columnar portions of the first screws 20*a* are engaged with the first screw holes 31.

<Damper>

Next, with reference to FIGS. 2 and 3A to 3D, the damper 6*a* will be described. The damper 6*a* is a member for relieving stress (external force) to the circuit board 1. For example, the damper 6*a* absorbs impact applied to the circuit board 1. Further, the damper 6*a* protects the circuit board 1 from stresses such as assembly strain, thermal shock, and vibration. The damper 6*a* is also referred to as a member that relaxes stress to the insulating substrate 4*a*.

Figure 3A:
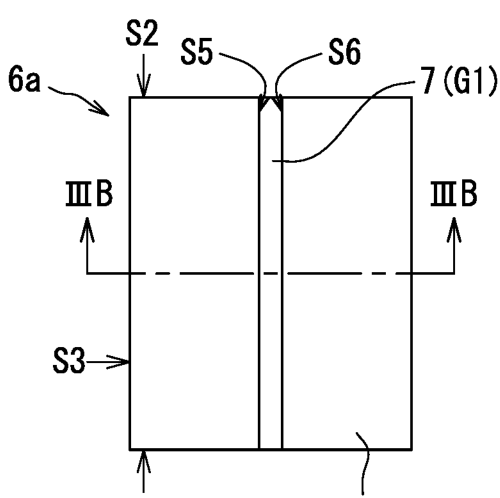
FIG. 3A is a diagram illustrating a schematic configuration of a damper in a first form of the first embodiment.
Figure 3C:
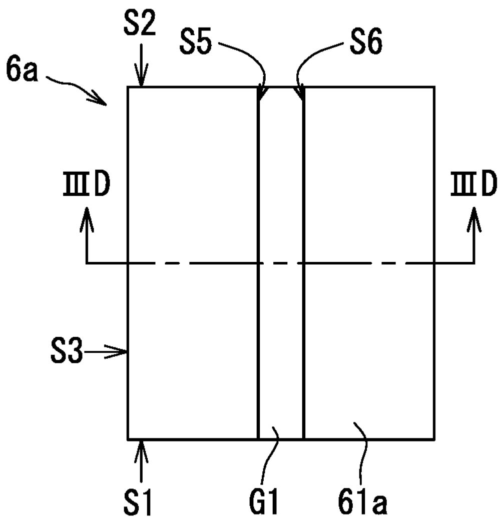
FIG. 3C is a diagram illustrating a schematic configuration of the damper in a second form of the first embodiment.
Figure 3B:
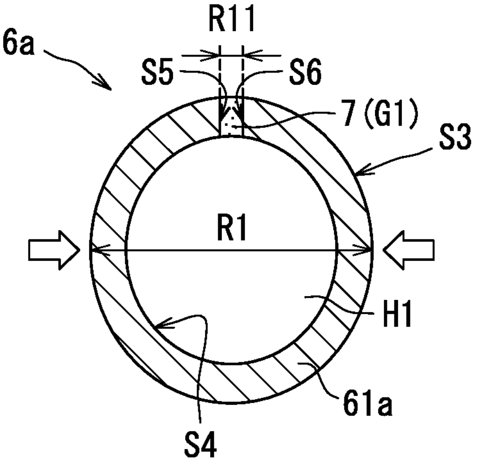
FIG. 3B is a cross-sectional view taken along a line IIIB-IIIB in FIG. 3A.
Figure 3D:
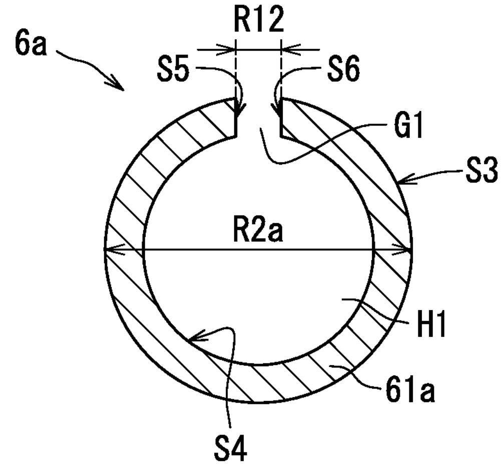
FIG. 3D is a cross-sectional view taken along a line IIID-IIID in FIG. 3C.

The damper 6*a* includes a damper tubular body 61*a*. There is a gap G1 in the damper tubular body 61*a*. The damper tubular body 61*a* corresponds to a tubular body. The damper tubular body 61*a* is configured to be in two forms. FIGS. 3A to 3D illustrate the two forms of the damper tubular body 61*a*. FIG. 3A is a side view of the damper tubular body 61*a* in a first form. FIG. 3B is a cross-sectional view taken along a line IIIB-IIIB in FIG. 3A. FIG. 3C is a side view of the damper tubular body 61*a* in a second form. FIG. 3D is a cross-sectional view taken along a line IIID-IIID in FIG. 3C. The two forms will be described in detail later.

The damper tubular body 61*a* includes a first surface S1, the second surface S2 that is opposite to the first surface S1, an outer circumferential surface S3 and an inner circumferential surface S4 that are connected to both the first surface S1 and the second surface S2. The distance between the first surface S1 and the second surface S2 is the height of the damper tubular body 61*a*. Further, the distance between the outer circumferential surface S3 and the inner circumferential surface S4 is the thickness of the damper tubular body 61*a*.

In the present embodiment, as an example of the damper tubular body 61*a*, the first surface S1 and the second surface S2 are parallel to each other. Further, in the present embodiment, as an example, the damper tubular body 61*a* has a cylindrical shape. However, the present disclosure is not limited to this. The first surface S1 corresponds to a first end. The second surface S2 corresponds to a second end.

The damper tubular body 61*a* defines a through hole H1 extending between the first surface S1 and the second surface S2. The through hole H1 is surrounded by the inner circumferential surface S4. In other words, the damper tubular body 61*a* defines the through hole H1 along the second insertion hole 41*a* when the damper 6*a* is held by the circuit board 1 (the insulating substrate 4*a*).

The gap G1 extends between the first surface S1 and the second surface S2 of the damper tubular body 61*a*. Thus, when the damper tubular body 61*a* is viewed from the first surface S1 or the second surface S2, the damper tubular body 61*a* has an annular shape, a part of which is cut off at the gap G1. The damper tubular body 61*a* includes a first end surface S5 that is one end in the circumferential direction and a second end surface S6 that is the other end in the circumferential direction. The gap G1 is an area between the first end surface S5 and the second end surface S6. Thus, the first end surface S5 and the second end surface S6 are arranged to face each other across the gap G1. The gap G1 can be rephrased as a slit, a clearance, or the like.

Here, the two forms of the damper tubular body 61*a* will be described. The damper tubular body 61*a* can be in the first form that has an outer shape smaller than the second insertion hole 41*a* and in the second form that has an outer shape equal to or larger than the second insertion hole 41*a*. In other words, the outer shape of the damper tubular body 61*a* in the first form is smaller than an opening area of the second insertion hole 41*a*. On the other hand, the outer shape of the damper tubular body 61*a* in the second form is larger than the opening area of the second insertion hole 41*a*. Thus, the damper tubular body 61*a* in the first form can be inserted into the second insertion hole 41*a* without being deformed. On the other hand, the damper tubular body 61*a* in the second form cannot be inserted into the second insertion hole 41*a* without being deformed. The outer shape of the damper tubular body 61*a* is an area surrounded by an annular curve that is defined by the outer circumferential surface S3.

In particular, in the present embodiment, as an example, the damper tubular body 61*a* can be deformed between the first form having the small gap G1 and the second form having the wide gap G1. That is, the gap G1 in the second form is wider than the gap G1 in the first form. In other words, the gap G1 in the first form is narrower than the gap G1 in the second form. As shown in FIG. 3B, the gap G1 in the first form has a first distance R11 between the first end surface S5 and the second end surface S6. On the other hand, as shown in FIG. 3D, the gap G1 in the second form has a second distance R12 between the first end surface S5 and the second end surface S6. The first distance R11 is shorter than the second distance R12. As described above, the gap G1 has a different size between the first form and the second form.

The first end surface S5 and the second end surface S6 of the damper tubular body 61*a* in the first form are located closer to each other than in the second form and connected with an adhesive 7. That is, the damper tubular body 61*a* in the first form is connected with the adhesive 7 while pressed in directions of the white arrows in FIG. 3B. When the adhesive 7 is melted with heat, the damper tubular body 61*a* is deformed to the second form from the first form with restoring force. Thus, as shown in FIGS. 3B and 3D, the damper tubular body 61*a* has an elliptical shape in the first form and has a shape closer to a true circle than to the elliptical shape in the second form.

Further, the reference numeral R1 in FIG. 3B is given to a first outer diameter of the damper tubular body 61*a* in the first form. The first outer diameter R1 is shorter than an inner diameter R21 of the second insertion hole 41*a*.

Reference numeral R2*a* in FIG. 3D is given to a second outer diameter of the damper tubular body 61*a* in the second form. More specifically, the outer diameter in the second form differs between a state where the damper tubular body

61*a* is inserted into the second insertion hole 41*a* and a state where the damper tubular body 61*a* is not inserted into the second insertion hole 41*a*. The second outer diameter R2*a* is the outer diameter in the second form when the damper tubular body 61*a* is not inserted into the second insertion hole 41*a*. The second outer diameter R2*a* is equal to the diameter of the damper tubular body 61*a* when no external force is applied to the damper tubular body 61*a*.

On the other hand, as shown in FIG. 6, a third outer diameter R2*b* is defined as the outer diameter of the damper tubular body 61*a* in the second form in a state where the damper tubular body 61*a* is inserted into the second insertion hole 41*a*. The third outer diameter R2*b* is equal to the inner diameter R21 of the second insertion hole 41*a*. The second outer diameter R2*a* is longer than the third outer diameter R2*b*.

As will be described in detail later, the damper tubular body 61*a* is inserted into the second insertion hole 41*a* and presses the insertion hole surface S11, thereby the damper tubular body 61*a* is held in the insulating substrate 4*a*. To achieve this, the damper tubular body 61*a* is formed such that the second outer diameter R2*a* is longer than the third outer diameter R2*b*. Similarly, the second distance R12 differs between the state where the damper tubular body 61*a* is inserted into the second insertion hole 41*a* and the state where the damper tubular body 61*a* is not inserted into the second insertion hole 41*a*.

Each of the outer diameters R1, R2*a*, and R2*b* is a distance of the outer circumferential surface S3 of the damper tubular body 61*a* on a virtual straight line perpendicular to a center axis of the damper tubular body 61*a* that extends along the through hole H1. Further, each of the outer diameters R1, R2*a*, and R2*b* is a distance of portions of the damper tubular body 61*a* that face the insertion hole surface S11 when the damper tubular body 61*a* is inserted into the second insertion hole 41*a*.

In the first form of the damper tubular body 61*a*, the first end surface S5 and the second end surface S6 are connected with the adhesive 7. That is, the gap G1 is filled with the adhesive 7. As the adhesive 7, one that is melted with heat is adopted.

The damper 6*a* may have a configuration in which a part of the damper tubular body 61*a* in the passing-through direction can be deformed between the first form and the second form. That is, when the damper 6*a* is coupled to the circuit board 1, only the portion of the damper 6*a* that is to be arranged in the second insertion hole 41*a* and the portion of the damper 6*a* to pass through the second insertion hole 41*a* may be deformed between the first form and the second form.

The damper tubular body 61*a* is configured to be elastically deformable. Thus, in the present embodiment, a wire mesh is adopted as an example of the damper tubular body 61*a*. The wire mesh is formed by weaving metal wires such that spaces are defined in the damper tubular body 61*a*. The wire mesh is not limited to the one in which the metal wires are woven regularly. The wire mesh may be formed by intricately weaving metal wires such that the metal wires are entangled with each other. The damper tubular body 61*a* is also referred to as a shock-absorbing member or a stress cushioning member.

Further, the wire mesh is also referred to as a continuous porous body in which metal wires are entangled with each other. Further, in other words, the wire mesh is formed by compressing the metal wires that are entangled with each other. The wire mesh is also referred to as a metal cushioning member. As the metal wire, for example, stainless steel or the like can be adopted. However, the metal wire is not limited to stainless steel. Aluminum, iron, or the like can also be used as the metal wire. When the wire mesh is adopted, the adhesive 7 may be an organic material such as a resin or a solder used for metal bonding as long as the adhesive 7 is melted with heat.

However, the present disclosure is not limited to this. The damper tubular body 61*a* may be composed mainly of a shape memory alloy. This is preferable because the damper tubular body 61*a* may be easily deformed to the second form from the first form. Further, the damper tubular body 61*a* may be made of rubber or the like. However, when rubber is used, it is preferable that the adhesive 7 be an organic material such as a resin.

Further, the damper tubular body 61*a* may include a protecting member that is composed mainly of an organic substance having viscoelasticity. As the protecting member, for example, a silicone member or the like can be adopted. The protecting member mainly protects the damper tubular body 61*a* not to deteriorate its functions. That is, the protecting member restricts foreign matters from adhering to the damper tubular body 61*a* not to deteriorate the functions. Further, the protecting member also has a function of restricting scrap metal and the like from falling out from the damper tubular body 61*a* to the periphery of the damper tubular body 61*a*. The protecting member soaks into the damper tubular body 61*a*, thereby the protecting member is disposed in the spaces in the wire mesh of the damper tubular body 61*a*. Foreign matters that adhere to or enter into the damper tubular body 61*a* are substances containing water, salt, oil, and the like.

The viscosity of the protecting member changes through UV curing or the like. Further, the viscosity of the protecting member is adjusted by ultraviolet rays or the like while the protecting member is provided in the spaces. At this time, the viscosity is adjusted so that the characteristics of the damper 6*a* have desired values. In other words, the compressibility of the damper tubular body 61*a* is adjusted to a desired value by adjusting the viscosity of the protecting member.

The damper 6*a* is held in the second insertion hole 41*a* of the insulating substrate 4*a*. The damper 6*a* is held in a state where the damper tubular body 61*a* is press-fit into the second insertion hole 41*a*. Thus, the damper 6*a* is held in the second insertion hole 41*a* by the restoring force of the damper tubular body 61*a*. The damper 6*a* is held in a state where at least two points on the outer circumferential surface S3 are in contact with the insertion hole surface S11 of the second insertion hole 41*a* with pressure. Further, the damper tubular body 61*a* in the second form is arranged in the second insertion hole 41*a* and presses the insertion hole surface S11 of the second insertion hole 41*a*. In other words, the damper 6*a* is fixed to the second insertion hole 41*a* with the restoring force of the damper tubular body 61*a*.

As shown in FIG. 2, the damper 6*a* is pressed against the base 3*a* with the second screw 202 while being held in the second insertion hole 41*a*. In other words, the damper 6*a* is held between the screw head 202*b* and the pedestal 34*a* while the second screw 202 is screwed into the second screw hole 32. In this state, the first surface S1 of the damper 6*a* is in contact with the base pressing surface S21 and the second surface S2 of the damper 6*a* is in contact with the screw pressing surface S31. In this way, the circuit board 1 is supported by the base 3*a* via the damper 6*a*. In this embodiment, as an example, the damper 6*a* defines the gap G1. However, the present disclosure is not limited to this, and as shown in an eighth modification, the gap G1 may not be defined in the damper 6*a*.

<Production Method>

Figure 4:
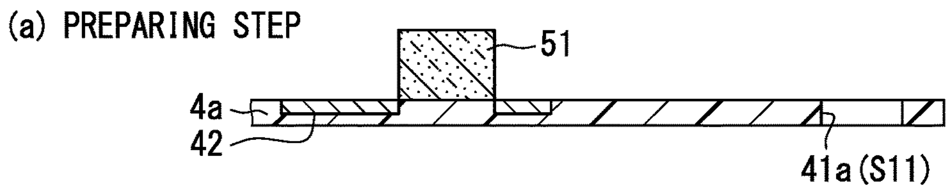
FIG. 4 is an explanatory diagram illustrating a method for manufacturing the electronic controller of the first embodiment.
Figure 4:
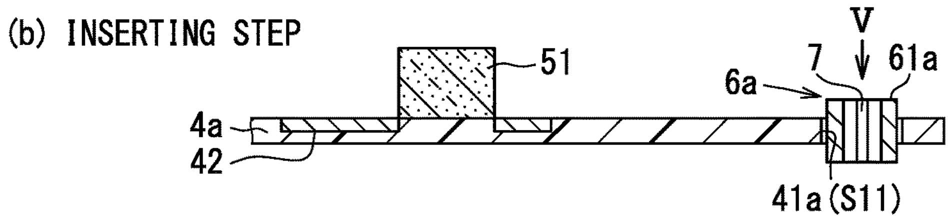
Figure 4:
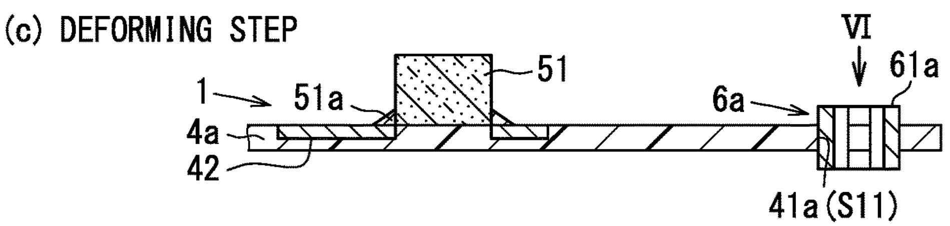
Figure 4:
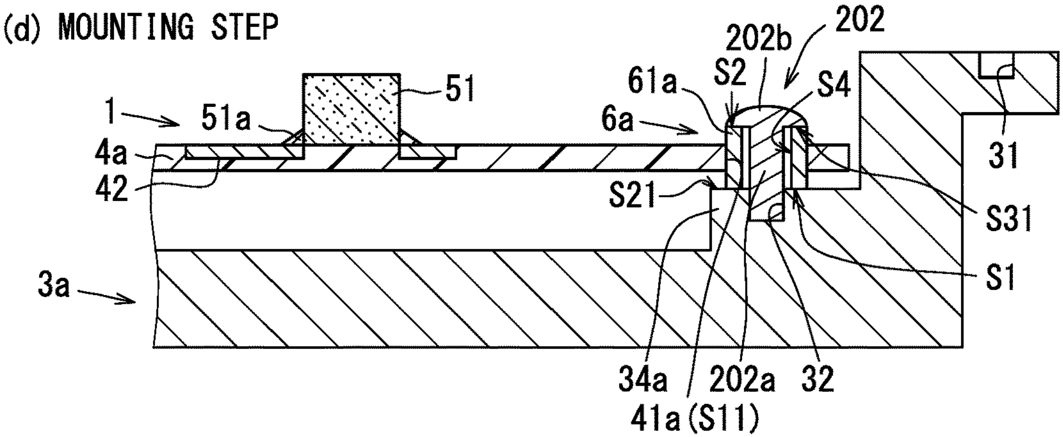
Figure 4:
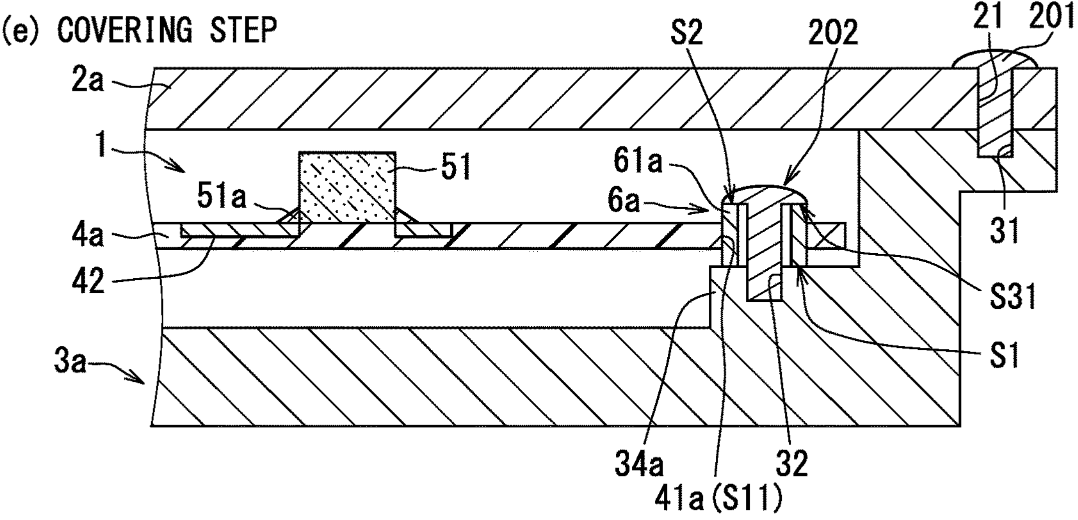

With reference to FIGS. 4, 5, and 6, a method for producing the electronic controller 100 will be described. As shown in FIG. 4, the method includes (a) a preparing step, (b) an inserting step, (c) a deforming step, (d) a mounting step, and (e) a covering step. Further, the inserting step and the deforming step correspond to a method for coupling the damper 6*a* to the circuit board 1.

In (a) the preparing step in FIG. 4, a first structure that the circuit element 51 is arranged on the insulating substrate 4*a* is prepared. In (b) the inserting step in FIG. 4, the damper tubular body 61*a* in the first form is inserted into the second insertion hole 41*a*. At this time, the damper tubular body 61*a* has the first outer diameter R1. Thus, as shown in FIG. 5, there is a sufficient gap between the outer circumferential surface S3 of the damper 6*a* and the insertion hole surface S11. Therefore, in the inserting step, the damper 6*a* can be easily inserted into the second insertion hole 41*a*. Further, in the inserting step, it is preferable to use a supporter or the like that supports the damper 6*a* so that the damper 6*a* does not come off from the second insertion hole 41*a*. The circuit element 51 may be arranged on the insulating substrate 4*a* after the inserting step.

In (c) the deforming step shown in FIG. 4, after the inserting step, the adhesive 7 is melted with heat and the damper 6*a* is deformed to the second form. As a result, the damper tubular body 61*a* presses the insertion hole surface S11. At this time, the damper tubular body 61*a* has the third outer diameter R2*b*. Thus, as shown in FIG. 6, the entire circumference of the damper 6*a* except for the gap G1 presses the insertion hole surface S11. Therefore, there is no gap between the outer circumferential surface S3 of the damper 6*a* and the insertion hole surface S11. In this way, in the deforming step, the damper tubular body 61*a* is deformed, so that the damper 6*a* is held in the insulating substrate 4*a*.

However, the present disclosure is not limited to this. In the present disclosure, it is only required that at least two points of the outer circumferential surface S3 press the insertion hole surface S11.

The producing method includes a reflow step of mounting the circuit elements 51 and 52 on the insulating substrate 4*a*. In the reflow step, terminals of the circuit elements 51 and 52 and the wiring pattern 42 are connected with solder 51*a* by reflow soldering. In the reflow step, the first structure is heated in a reflow furnace to melt the solder 51*a*. Therefore, the deformation step can be performed together with the reflow step. As described above, in the assembly method of the present embodiment, it is not necessary to perform the deforming step separately from the reflow step.

A second structure is a structure that the circuit elements 51 and 52 are mounted on the insulating substrate 4*a* and the damper 6*a* is held in the insulating substrate 4*a*. That is, the second structure is one that the damper 6*a* is attached to the circuit board 1.

In the present embodiment, the adhesive 7 is melted with heat to deform the damper tubular body 61*a*. Therefore, the damper tubular body 61*a* is preferably formed by weaving metal wires. However, the damper tubular body 61*a* may be made of rubber or the like that can withstand the temperature at which the adhesive 7 is melted.

In (d) the mounting step shown in FIG. 4, the second structure is arranged on the base 3*a*. In the mounting step, the second structure is arranged at a position where the through hole H1 faces the second screw hole 32. Further, in the mounting step, the second structure is arranged at a position where the first surface S1 of the damper 6*a* is in contact with the base pressing surface S21.

After that, in the mounting step, the second screw 202 is screwed into the second screw hole 32. At this time, the damper 6*a* is pressed by the screw pressing surface S31. Along with this, the base pressing surface S21 is pressed by the damper 6*a*. Thus, the damper 6*a* is pressed (compressed) between the screw head 202*b* and the pedestal 34*a* while the damper 6*a* is in contact with both the base pressing surface S21 and the screw pressing surface S31. In this way, the circuit board 1 is supported by the base 3*a* through the damper 6*a*.

After the mounting step, the damper tubular body 61*a* may have a configuration in which a gap is defined between the inner circumferential surface S4 and the columnar portion 202*a*, or may have a configuration in which no gap is defined therebetween. However, the damper tubular body 61*a* preferably has the configuration in which the gap is defined because the damper tubular body 61*a* can be elastically deformed more easily in the plane direction than the configuration in which the gap is not defined.

In (e) the covering step shown in FIG. 4, after the mounting step, the cover 2*a* is attached to the base 3*a* to house the second structure. In the covering step, the cover 2*a* is arranged on the base 3*a* on which the second structure is mounted. At this time, the cover 2*a* is arranged at a position where the first insertion holes 21 face the first screw holes 31. In the covering step, the first screws 201 are screwed into the first screw holes 31. Thereby, the electronic controller 100 in which the second structure is housed in the housing space defined by the base 3*a* and the cover 2*a* can be manufactured.

<Effects>

In this way, the circuit board 1 is supported by the base 3*a* through the damper 6*a* fixed to the insulating substrate 4*a*. Further, the damper 6*a* is pressed between the screw head 202*b* and the pedestal 34*a*. Thus, stress applied to the insulating substrate 4*a* in the thickness direction elastically deforms the damper 6*a* in the thickness direction between the screw head 202*b* and the pedestal 34*a*. The damper 6*a* has an area facing the insertion hole surface S11. An upper portion and a lower portion of the area of the damper 6*a* are mainly elastically deformed. Thus, the damper 6*a* can protect the circuit board 1 when stress is applied to the insulating substrate 4*a* in the thickness direction.

Further, the damper 6*a* defines the gap G1. Thus, the damper 6*a* is easily elastically deformed in the intersecting direction. Thus, the damper 6*a* can relax not only the stress to the circuit board 1 in the thickness direction but also stress to the circuit board 1 in the intersecting direction. Therefore, the damper 6*a* can appropriately relax the stress to the circuit board 1. There may be a gap between the inner circumferential surface S4 and the columnar portion 202*a* while the damper 6*a* is pressed by the second screw 202. With the gap, the damper 6*a* is easily elastically deformed in the intersecting direction.

Further, the damper 6*a* is configured to form the first form and the second form. Thus, the damper 6*a* can be easily inserted into the second insertion hole 41*a* and can be easily fixed to the insulating substrate 4*a*. That is, since the damper 6*a* can form the first form in which the outer shape of the damper tubular body 61*a* is smaller than the second insertion hole 41*a*, the damper 6*a* can be easily inserted into the second insertion hole 41*a*. Further, since the damper tubular body 61*a* is configured to form the second form in which the outer shape of the damper tubular body 61*a* is equal to or larger than the second insertion hole 41*a*, the damper 6*a* can secure holding force for the circuit board 1. As described above, the damper 6*a* can be easily inserted into the second insertion hole 41*a* while the damper 6*a* secures the holding force for the circuit board 1.

The electronic controller 100 includes the damper 6*a*. The damper 6*a* has the above-mentioned effects. Thus, the electronic controller 100 can restrict the solder 51*a*, the wiring pattern 42, and the like from being cracked or restricts malfunctions of the circuit elements 51 and 52 due to the stress applied to the insulating substrate 4*a*. Thus, the electronic controller 100 can suppress bad effects on electrical characteristics of the circuit board 1.

More specifically, the circuit board 1 is supported by the base 3*a* with the second screws 202. However, the circuit board 1 is supported by the base 3*a* through the damper 6*a*. Thus, when the circuit board 1 itself is distorted or an external force is applied to the circuit board 1, the damper 6*a* is elastically deformed. Therefore, in the circuit board 1, it is possible to restrict the solder 51*a*, the wiring pattern 42, and the like from being cracked and to restrict malfunctions of the circuit elements 51 and 52 due to the stress applied to the insulating substrate 4*a*.

Further, in the electronic controller 100, an influence caused by assembly distortion may be reduced by adjusting mounting positions of the circuit elements 51 and 52. That is, in the electronic controller 100, the circuit elements 51 and 52 may be mounted at positions away from screwing positions so as not to be affected by the assembly distortion. In this case, in the electronic controller 100, the distances between the screwing positions and the circuit elements 51 and 52 may be a factor that obstructs high-density mounting. However, in the present embodiment, the influence of the assembly distortion is mitigated by the damper 6*a*. Therefore, in the electronic controller 100, the circuit elements 51 and 52 can be mounted at high density.

In the present embodiment, a wire mesh is adopted as an example of the damper tubular body 61*a*. Thus, deterioration of the damper 6*a* over time can be restricted as compared with the case where rubber is used as the damper tubular body 61*a*.

In this embodiment, the second screw 202 is adopted as an example of the supporting element. However, in the present disclosure, a member using elastic deformation such as a snap fit can be adopted as the supporting element. Further, in the present embodiment, the circuit board 1 is adopted as an example of the supported member. However, in the present disclosure, the base 3*a* may be the supported member. In this case, the supporting member may be a vehicle frame or the like. Further, in the present disclosure, the cover 2*a* may be the supported member. In this case, the base 3*a* may be the supporting member. The first screw 201 can be adopted as a supporting element.

The circuit board 1 may be supported by the base 3*a* with the first screws 201 instead of the second screws 202. In this case, the first screw 201 corresponds to the supporting element.

First Modification

Figure 7:
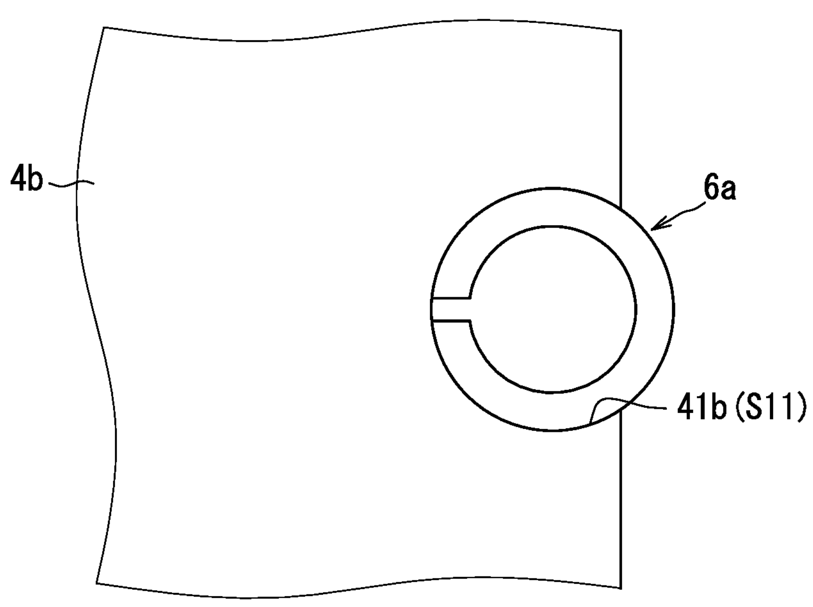
FIG. 7 is a plan view illustrating a state where the damper is hold in an insulating substrate of a first modification.

With reference to FIG. 7, the electronic controller 100 of a first modification will be described. In the electronic controller 100 of the first modification, the configuration of the insulating substrate 4*b* is different from that of the above embodiment. However, in the electronic controller 100 of the first modification, the same reference numerals as those in the above embodiment are donated for convenience. The reference numeral 100 is adopted for the electronic controller 100 in other modifications and other embodiments.

As shown in FIG. 7, the shape of the second insertion hole 41*b* of the insulating substrate 4*b* is different from that of the insulating substrate 4*a*. The second insertion hole 41*b* is a through hole surrounded by an insertion hole surface S11. The insertion hole surface S11 has an annular shape, a part of which is cut off. In other words, the second insertion hole 41*b* is a recess recessed from the side wall of the insulating substrate 4*b*. The damper 6*a* can be inserted into the second insertion hole 41*b* in the thickness direction. Further, the damper 6*a* can be inserted into the second insertion hole 41*b* in a direction perpendicular to the thickness direction. The electronic controller 100 of the first modification can achieve similar effects to those of the above embodiment. The first modification can be applied to other embodiments and other modifications.

Second Modification

Figure 8:
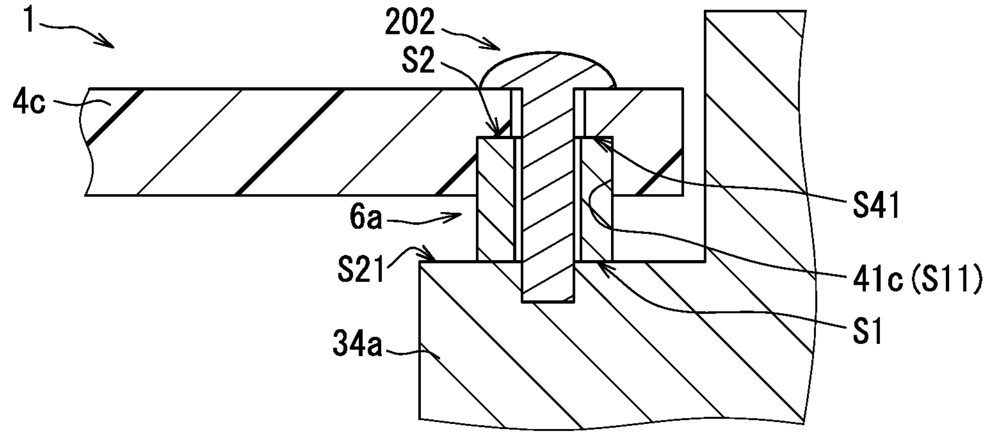
FIG. 8 is a cross-sectional view illustrating a state where the damper is hold in an insulating substrate of a second modification.

With reference to FIG. 8, the electronic controller 100 of a second modification will be described. The electronic controller 100 of the second modification is different from the above embodiment in a configuration of the insulating substrate 4*c*.

As shown in FIG. 8, the shape of the second insertion hole 41*c* of the insulating substrate 4*c* is different from that of the insulating substrate 4*a*. The second insertion hole 41*c* is surrounded by the annular insertion hole surface S11, and an opening diameter of the second insertion hole 41*c* differs in the thickness direction. The second insertion hole 41*c* is divided into a portion into which the damper 6*a* and the columnar portion 202*a* of the second screw 202 are inserted and a portion into which the damper 6*a* is not inserted. A portion of the columnar portion 202*a* of the second screw 202 is inserted in the portion where the damper 6*a* is not inserted. The portion where the damper 6*a* and the columnar portion 202*a* of the second screw 202 are inserted has a substrate pressing surface S41 as a bottom surface.

Thus, the damper 6*a* is inserted into the second insertion hole 41*c*, and the second surface S2 of the damper 6*a* is in contact with the substrate pressing surface S41. Further, the damper 6*a* is pressed between the substrate pressing surface S41 and the base pressing surface S21. The electronic controller 100 of the second modification can achieve similar effects to those of the above embodiment. The second modification can be appropriately applied to other embodiments and other modifications.

Second Embodiment

Figure 9A:
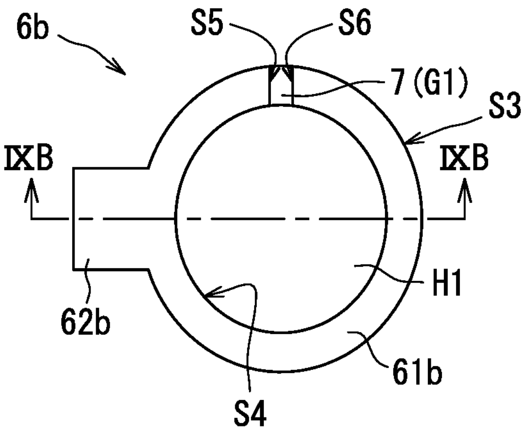
FIG. 9A is a diagram illustrating a schematic configuration of a damper of a second embodiment.
Figure 9B:
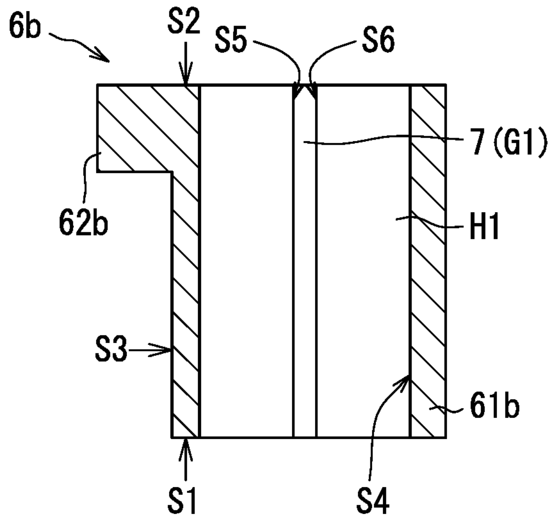
FIG. 9B is a cross-sectional view taken along a line IXB-IXB in FIG. 9A.
Figure 10:
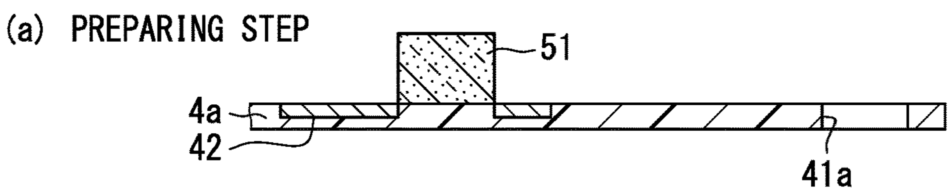
FIG. 10 is an explanatory diagram illustrating a method for manufacturing an electronic controller of the second embodiment.
Figure 10:
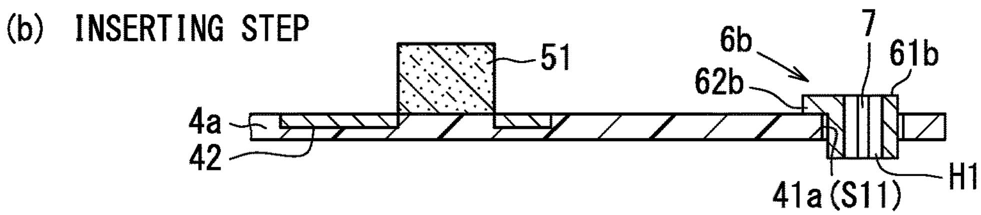
Figure 10:
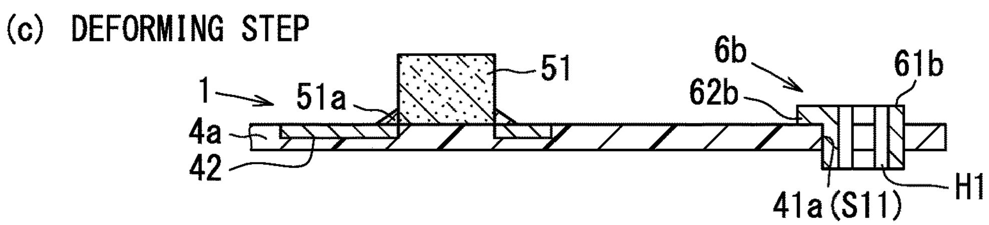
Figure 10:
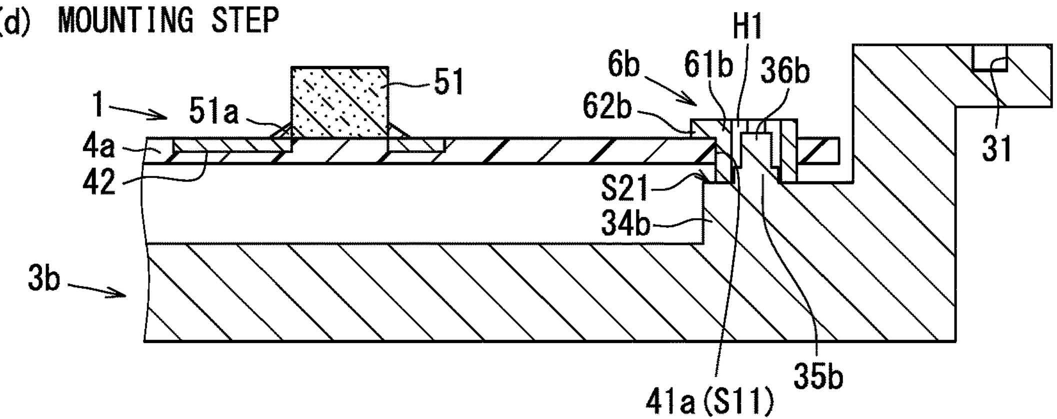
Figure 10:
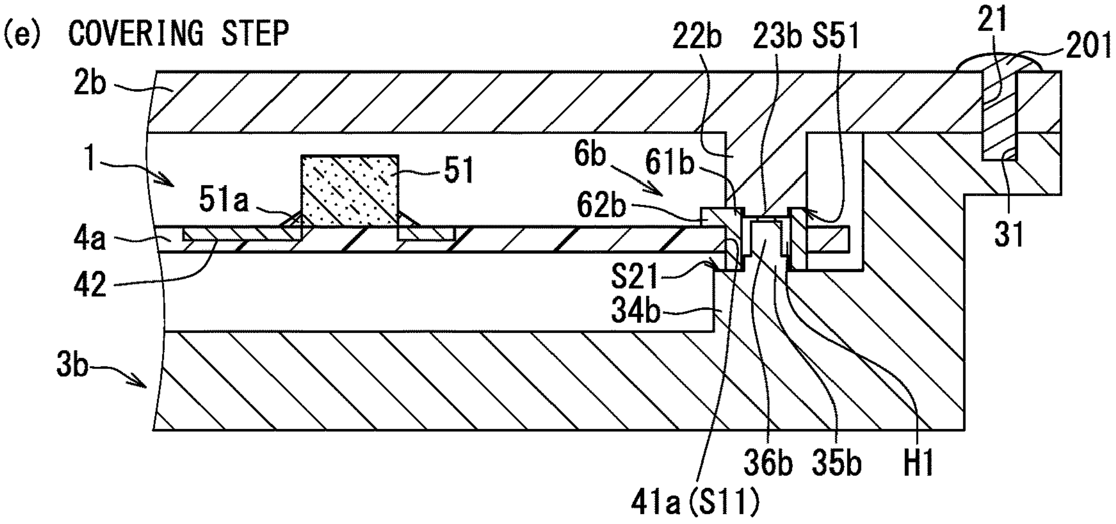

With reference to FIGS. 9A, 9B, and 10, a damper 6*b* of a second embodiment will be described. In this embodiment, portions different from those in the first embodiment will be mainly described. This embodiment is different from the first embodiment in configurations of the damper 6*b*, a cover 2*b*, and a base 3*b*. In this embodiment, the same reference numerals are given to the same configurations as those in the first embodiment.

As shown in FIGS. 9A and 9B, the damper 6*b* is different from the damper 6*a* in that the damper 6*b* includes a damper protrusion 62*b*. The damper 6*b* includes a damper tubular body 61*b* and the damper protrusion 62*b*. The damper tubular body 61*b* is the same as the damper tubular body 61*a*.

The damper protrusion 62*b* corresponds to a protrusion. The damper protrusion 62*b* protrudes from the outer circumferential surface S3 of the damper tubular body 61*b*. The damper protrusion 62*b* is provided to prevent the damper 6*b* in the first form from coming off from the second insertion hole 41*a*.

The damper protrusion 62*b* is provided within a predetermined range from the second surface S2 in the height direction of the damper tubular body 61*b*. That is, the damper protrusion 62*b* is not provided in the entire area of the damper tubular body 61*b* in the height direction, but it is provided only in a portion of the damper tubular body 61*b* in the height direction.

Further, the damper protrusion 62*b* is provided only on a portion of the outer circumferential surface S3 in the circumferential direction. However, the present disclosure is not limited to this, and it is only required that the damper protrusion 62*b* be provided at least a part of the damper tubular body 61*b* in the circumferential direction. Thus, the damper protrusion 62*b* may be multiple damper protrusions arranged in the circumferential direction. For example, the two, three, four, or more damper protrusions 62*b* may be arranged in the circumferential direction at equal intervals. Further, the damper protrusion 62*b* may be provided in the entire area in the circumferential direction.

The damper protrusion 62*b* may be made of the same material as the damper tubular body 61*b*, or may be made of a different material. Further, the damper protrusion 62*b* may be integrally formed with the damper tubular body 61*b*, or formed by connecting different members.

Here, with reference to FIG. 10, a method for manufacturing the electronic controller 100 including the damper 6*b* will be described. Further, here, the configuration of the electronic controller 100 will also be described. The preparing step and the deforming step shown in FIG. 10 are the same as those in the first embodiment.

In (b) the inserting step shown in FIG. 10, the damper tubular body 61*b* in the first form is inserted into the second insertion hole 41*a* as in the first embodiment. At this time, there is a sufficient gap between the outer circumferential surface S3 of the damper 6*b* and the insertion hole surface S11. Thus, in the inserting step, the damper 6*b* can be easily inserted into the second insertion hole 41*a*.

However, the damper 6*b* includes the damper protrusion 62*b*. Thus, the damper protrusion 62*b* of the damper 6*b* is arranged in the vicinity of the second insertion hole 41*a* of the insulating substrate 4*a*. Therefore, in the inserting step, it is possible to prevent the damper 6*b* from coming off from the second insertion hole 41*a*.

In (d) the mounting step shown in FIG. 10, the second structure is arranged on the base 3*b* as in the first embodiment. Here, the base 3*b* will be described. The base 3*b* is different from the base 3*a* in that the base 3*b* includes a base positioning portion 35*b* and a distance adjusting portion 36*b*. The pedestal 34*b* is the same as the pedestal 34*a*.

The base positioning portion 35*b* positions the damper 6*b* with respect to the base 3*b*. The base positioning portion 35*b* protrudes from the pedestal 34*b* in the thickness direction. The base positioning portion 35*b* is inserted into the through hole H1 of the damper 6*b*.

The distance adjusting portion 36*b* restricts the inner circumferential surface S4 of the damper tubular body 61*b* from becoming closer than necessary. The distance adjusting portion 36*b* protrudes from a tip end of the base positioning portion 35*b* in the thickness direction. The thickness direction is the same as the direction perpendicular to the base pressing surface S21. The base 3*b* may not include the distance adjusting portion 36*b*.

In the mounting step, the second structure is arranged on the base 3*b* so that the base positioning portion 35*b* and the distance adjusting portion 36*b* are inserted into the through hole H1. Further, in the mounting step, the second structure is arranged at a position where the first surface S1 is in contact with the base pressing surface S21. Thus, in the mounting step, the damper 6*b* can be arranged at an appropriate position on the base 3*b*. Thus, in the mounting step, the second structure can be arranged at an appropriate position.

In the mounting step of the present embodiment, the second screws 202 are not used. Therefore, at the stage of the mounting step, the second structure is only arranged on the base 3*b*.

In (e) the covering step shown in FIG. 10, the cover 2*b* is attached to the base 3*b* to house the second structure as in the first embodiment. Here, the cover 2*b* will be described. The cover 2*b* is different from the cover 2*a* in that the cover 2*b* includes a cover protrusion 22*b* and a cover positioning portion 23*b*.

The cover protrusion 22*b* is provided on the side of the cover 2*b* facing the housing space. The cover protrusion 22*b* is a portion that presses the damper 6*b* against the pedestal 34*b*. The cover protrusion 22*b* protrudes more in the thickness direction than the periphery of the cover protrusion 22*b*. The tip end of the cover protrusion 22*b* has a cover pressing surface S51 that presses the damper 6*b*.

The cover positioning portion 23*b* positions the damper 6*b* with respect to the cover 2*b*. The cover positioning portion 23*b* protrudes from the tip end of the cover protrusion 22*b* in the thickness direction. That is, the cover pressing surface S51 is a portion of the tip end of the cover protrusion 22*b* where the cover positioning portion 23*b* is not provided.

In the covering step, the cover 2*b* is arranged on the base 3*b* on which the second structure is mounted. At this time, the cover positioning portion 23*b* is inserted into the through hole H1 to arrange the cover 2*b*. In the covering step, the first screws 201 are screwed into the first screw holes 31.

When the first screws 201 are engaged with the first screw holes 31, the cover pressing surface S51 presses the damper 6*b*. Along with this, the base pressing surface S21 is pressed by the damper 6*b*. Therefore, the damper 6*a* is pressed between the cover protrusion 22*b* and the pedestal 34*b* while the damper 6*b* is in contact with both the base pressing surface S21 and the cover pressing surface S51. In this way, the circuit board 1 is supported by the base 3*b* through the damper 6*b*. Thereby, the electronic controller 100 in which the second structure is housed in the housing space defined by the base 3*a* and the cover 2*a* can be manufactured.

The damper 6*b* can exert similar effects to those of the damper 6*a*. The damper 6*b* has an area facing the insertion hole surface S11. An upper portion and a lower portion of the area of the damper 6*b* are elastically deformed due to stress applied to the insulating substrate 4*a* in the thickness direction. Further, in the damper 6*b*, the damper protrusion 62*b* is elastically deformed between the insulating substrate 4*a* and the cover protrusion 22*b*. Thus, when stress is applied to the insulating substrate 4*a* in the thickness direction, the damper 6*b* can protect the circuit board 1.

Further, the damper 6*b* includes the damper protrusion 62*b*. Thus, the damper 6*b* in the first form can be retained in the second insertion hole 41*a*. That is, the damper 6*b* can be retained in the second insertion hole 41*a* without using a jig such as a supporting base.

In the method of the present embodiment, since the damper 6*b* includes the damper protrusion 62*b*, it is possible to restrict the damper 6*b* from coming off from the second insertion hole 41*a* during the inserting step. Thus, it is not necessary to use a supporting base or the like in the method of the present embodiment.

The damper 6*b* can be applied to the first embodiment and its modifications. The cover 2*b* and the base 3*b* can be applied to the first embodiment and its modifications. Further, the electronic controller 100 of the present embodiment can adopt the cover 2*a* and the base 3*a*. In this case, the second screw 202 is used.

Third Modification

With reference to FIGS. 11A to 11D, a damper 6*c* of a third modification will be described. In this modification, portions different from the second embodiment will be mainly described. The damper 6*c* of the third modification is different from the second embodiment mainly in that the damper 6*c* includes damper protrusions 62*c* and tabs 63*c*. FIGS. 11A to 11D illustrate the two forms of the damper tubular body 61*c* and the insulating substrate 4*a*. FIG. 11A is a plan view of the first form. FIG. 11B is a cross-sectional view taken along a line XIB-XIB in FIG. 11A. FIG. 11C is a plan view of the second form. FIG. 11D is a cross-sectional view taken along a line XID-XID in FIG. 11C.

As shown in FIGS. 11A to 11D, the damper 6*c* includes the damper tubular body 61*c*, the damper protrusions 62*c*, the tabs 63*c*, and recesses 64*c*. The damper tubular body 61*c* is the same as the damper tubular body 61*b*. Each of the damper protrusions 62*c* is the same as the damper protrusion 62*b*. Only the number of the damper protrusions are different. Each of the damper protrusions 62*c* corresponds to a second protrusion.

Each of the tab 63*c* corresponds to a first protrusion. The tab 63*c* protrudes from the outer circumferential surface S3 of the damper tubular body 61*c*. The tab 63*c* is provided to hold the insulating substrate 4*a* with the damper protrusion 62*c*.

The tab 63*c* is provided within a predetermined range from the first surface 51 in the height direction of the damper tubular body 61*c*. That is, the tab 63*c* is not provided in the entire area of the damper tubular body 61*b* in the height direction, but is provided only in a portion of the damper tubular body 61*b* in the height direction.

Further, the tab 63*c* is provided only on a portion of the outer circumferential surface S3 in the circumferential direction. However, the present disclosure is not limited to this. It is only required that the tab 63*c* be provided at least a part of the damper tubular body 61*b* in the circumferential direction. Thus, the tab 62*b* may be multiple tabs arranged in the circumferential direction. For example, two, three, four, or more tabs 62*b* may be arranged in the circumferential direction at equal intervals. Further, the tab 62*b* may be provided in the entire area in the circumferential direction.

The tab 63*c* tapers from a side of the tab 63*c* close to the second surface S2 toward the first surface S1. This makes it easier for the damper 6*c* to be inserted into the second insertion hole 41*a*.

The tab 63*c* may be made of the same material as the damper tubular body 61*b*, or may be made of a different material. Further, the tab 63*c* may be integrally formed with the damper tubular body 61*b*, or formed by connecting different members.

Each of the recesses 64*c* is provided between the damper protrusion 62*c* and the tab 63*c*. The recess 64*c* is located inward than the damper protrusion 62*c* and the tab 63*c*. The opening width of the recess 64*c* is equal to or greater than the thickness of the insulating substrate 4*a*. The opening width is a width of the recess 64*c* in the height direction of the damper tubular body 61*c*. Further, the opening width corresponds to the distance between the damper protrusion 62*c* and the tab 63*c* in the height direction. The bottom surface of the recess 64*c* is the outer circumferential surface S3.

As shown in FIGS. 11A and 11B, the damper protrusions 62*c* in the first form extends between the facing region of the second insertion hole 41*a* and an outside of the facing region. The facing region is defined by virtually extending an area of the second insertion hole 41*a* in the thickness direction. As shown in FIGS. 11C and 11D, the damper protrusions 62*c* in the second form are disposed outside of the facing region of the second insertion hole 41*a*.

On the other hand, as shown in FIG. 11B, the tabs 63*c* in the first form are arranged in the facing region of the second insertion hole 41*a*. As shown in FIG. 11D, the tabs 63*c* in the second form are arranged outside the facing region of the second insertion hole 41*a*.

As described above, the end portion of the insulating substrate 4*a* can be arranged in the recesses 64*c* when the damper 6*c* is in the second form. Thus, when stress is applied to the insulating substrate 4*a* in the thickness direction, the upper portion and the lower portion of the damper 6*b* facing the insertion hole surface S11 are elastically deformed. Further, the damper protrusions 62*c* and the tabs 63*c* of the damper 6*c* are elastically deformed. Thus, the damper 6*a* can protect the circuit board 1 when stress is applied to the insulating substrate 4*a* in the thickness direction.

The damper 6*c* can exert similar effects to those of the dampers 6*a* and 6*b*. Further, the damper 6*c* includes the damper protrusions 62*c*, the tabs 63*c*, and the recesses 64*c*. Therefore, the damper 6*c* can appropriately position the insulating substrate 4*a* with respect to the damper 6*c*. Further, the damper 6*c* can hold the insulating substrate 4*a* between the damper protrusions 62*c* and the tabs 63*c*. Therefore, the damper 6*c* can improve the holding force for the insulating substrate 4*a* as compared with the damper 6*a*.

In the electronic controller 100 including the damper 6*c*, the insulating substrate 4*a* is held by the damper protrusions 62*c* and the tabs 63*c*. Thus, in the electronic controller 100, the insulating substrate 4*a* can be held more strongly than in the case where the insulating substrate 4*a* is held by the damper 6*a*. Thus, in the electronic controller 100, the circuit board 1 can be more surely protected when stress is applied to the insulating substrate 4*a* in the thickness direction compared to the case including the damper 6*a*.

Fourth Modification

Figures 12, 13:
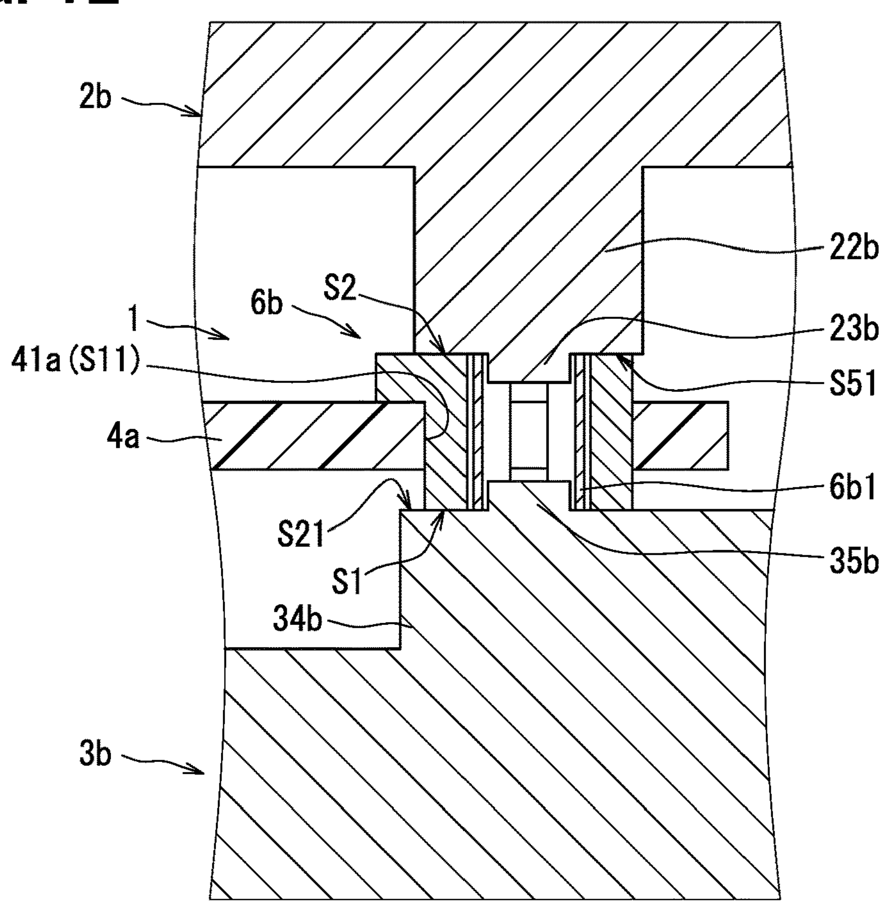
FIG. 12 is a cross-sectional view illustrating a schematic configuration of an electronic controller of a fourth modification.
FIG. 13 is a cross-sectional view illustrating a schematic configuration of an electronic controller of a fifth modification.

With reference to FIG. 12, the damper 6*b* of the fourth modification will be described. In this modification, portions different from the second embodiment will be mainly described. The damper 6*b* is different from that in the second embodiment in including a height adjusting member 6*b*1. However, in this modification, for convenience, the same reference numerals as those in the second embodiment are used. The base 3*b* in FIG. 12 has a configuration in which the distance adjusting portion 36*b* is not provided in the base 3*b* described in the second embodiment. The base 3*b* in FIG.

12 has the same configuration as the base 3_b_ described in the second embodiment except for the distance adjusting portion 36_b_.

The damper 6_b_ includes the height adjusting member 6_b_1 at a position surrounded by the damper tubular body 61_b_. The height adjusting member 6_b_1 corresponds to an adjusting member. The height adjusting member 6_b_1 has, for example, a tubular shape.

The height adjusting member 6_b_1 is composed mainly of metal. However, the present disclosure is not limited to this. A member made mainly of a resin may be used as the height adjusting member 6_b_1.

The height adjusting member 6_b_1 is configured to adjust the height of the damper tubular body 61_b_ that is the distance between the first surface S1 and the second surface S2. Further, it can be said that the height adjusting member 6_b_1 is provided to set the compressibility of the damper tubular body 61_b_ to a desired value. That is, since the damper 6_b_ includes the height adjusting member 6_b_1, it is possible to restrict the damper 6_b_ from being compressed more than necessary by the second screws 202 or the like and from losing the function of relaxing the stress to the circuit board 1. The damper 6_b_ of the fourth modification can also achieve similar effects to those of the damper 6_b_ of the second embodiment. The height adjusting member 6_b_1 can also be applied to the first embodiment and other modifications.

Fifth Modification

With reference to FIG. 13, a damper 6_d_ of a fifth modification will be described. In this modification, portions different from the second embodiment will be mainly described. The damper 6_d_ is different from the second embodiment in including a cover.

The damper 6_d_ includes a damper tubular body 61_d_ and a damper protrusion 62_d_. The damper tubular body 61_d_ is the same as the damper tubular body 61_b_. The damper protrusion 62_d_ is the same as the damper protrusion 62_b_.

The cover includes a bottom surface cover 6_d_3 and a member having a side surface 6_d_1 and an upper surface 6_d_2. The side surface 6_d_1, the upper surface 6_d_2, and the bottom cover 6_d_3 are composed mainly of metal, resin, or the like. The side surface 6_d_1, the upper surface 6_d_2, and the bottom cover 6_d_3 may be made of the same material or may be made of different materials.

The side surface 6_d_1 and the upper surface 6_d_2 are integrally formed with each other, for example. The side surface 6_d_1 is a tubular member and is arranged to face the inner circumferential surface S4. The side surface 6_d_1 also serves as the height adjusting member. The upper surface 6_d_2 is disposed at an end of the side surface 6_d_1. The upper surface 6_d_2 is arranged to face the second surface S2.

The bottom cover 6_d_3 is arranged to face the first surface S1. The bottom cover 6_d_3 is a different member from the side surface 6_d_1. The bottom cover 6_d_3 is arranged to face the side surface 6_d_1. The damper tubular body 61_d_ is disposed between the upper surface 6_d_2 and the bottom cover 6_d_3.

The damper 6_d_ can achieve similar effects to those of the second embodiment and the fourth modification. Further, the side surface 6_d_1, the upper surface 6_d_2, and the bottom cover 6_d_3 of the damper 6_d_ can protect the damper tubular body 61_d_ and the damper protrusion 62_d_. That is, it is possible to restrict foreign matters from adhering to the damper tubular body 61_d_ and the damper protrusion 62_d_ of the damper 6_d_. Thus, it is possible to restrict deterioration of the damper 6_d_ caused by the foreign matters adhered to the damper 6_d_.

Third Embodiment

Figure 14:
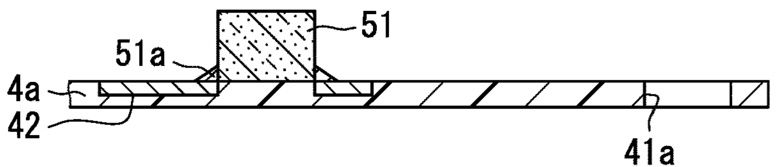
FIG. 14 is an explanatory diagram illustrating a method for manufacturing an electronic controller of a third embodiment.
Figure 14:
Figure 14:
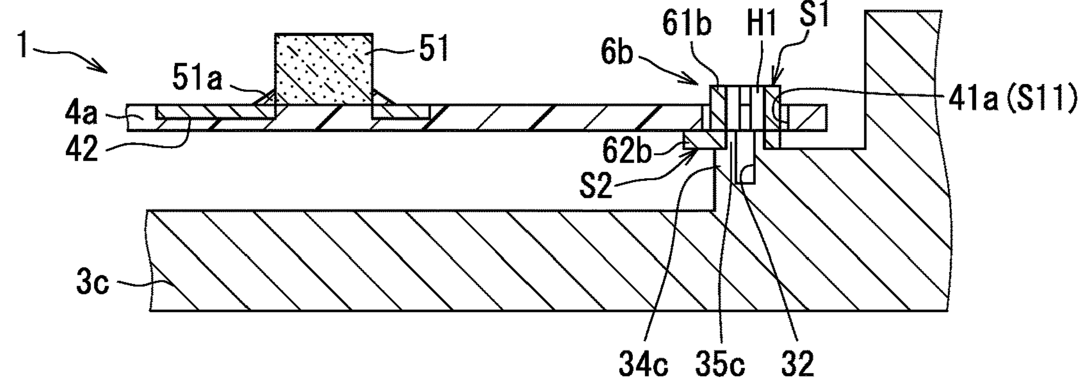
Figure 14:
Figure 14:
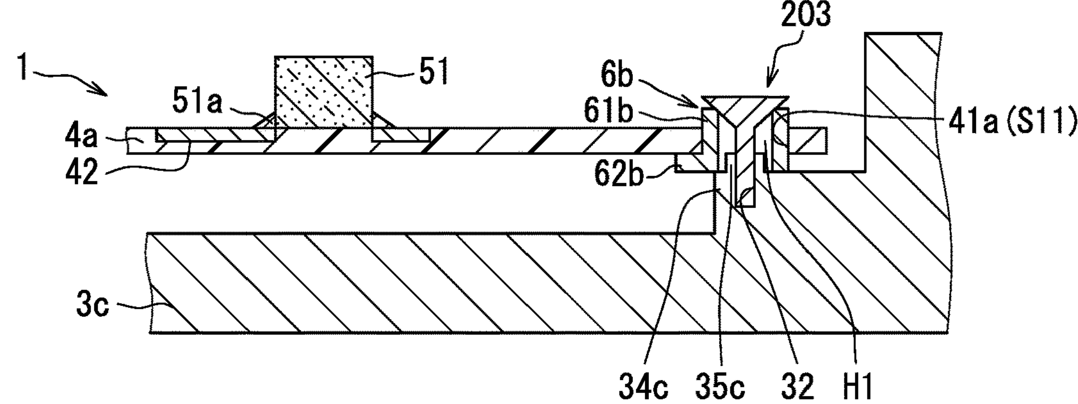
Figure 15:
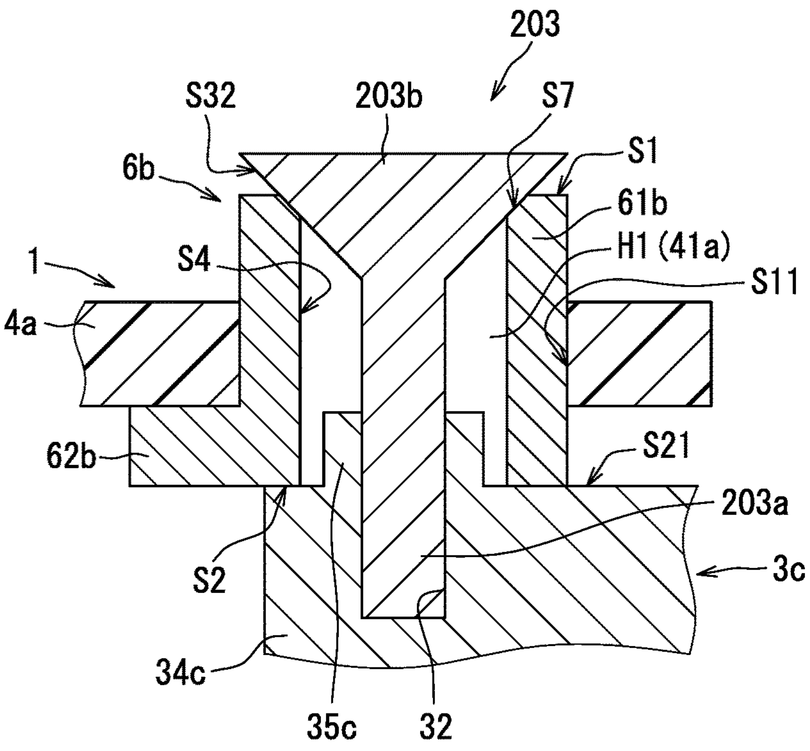
FIG. 15 is a cross-sectional view illustrating a schematic configuration of the electronic controller of the third embodiment.

With reference to FIGS. 14 and 15, the electronic controller 100 of a third embodiment will be described. In this embodiment, portions different from those in the second embodiment will be mainly described. In this embodiment, the configuration of the second screw 203 is different from that of the second embodiment. Along with this, in this embodiment, the shape of the damper 6_b_ is different from that of the second embodiment. Further, in the present embodiment, the configuration of the base 3_c_ and the deforming step are different from those in the second embodiment.

As shown in FIGS. 14 and 15, the base 3_c_ includes a pedestal 34_c_, a base positioning portion 35_c_, and a second screw hole 32. The pedestal 34_c_ is the same as the pedestal 34_b_. The base positioning portion 35_c_ is the same as the base positioning portion 35_b_. The second screw hole 32 is defined in the base positioning portion 35_c_. That is, the base 3_c_ can be regarded to have a configuration in which the distance adjusting portion 36_b_ is omitted from the base 3_b_ and the second screw hole 32 is defined in the base 3_b_. However, the base 3_c_ may include the distance adjusting portion 36_b_ defining the second screw hole 32.

As shown in FIG. 15, the second screw 203 includes a columnar portion 203_a_ and a screw head 203_b_, similarly to the second screw 202. The second screw 203 corresponds to a fixing member, the columnar portion corresponds to a fixed portion, and the screw head 203_b_ corresponds to a pressing portion. The columnar portion 203_a_ is the same as the columnar portion 202_a_. The screw head 203_b_ has a screw tilted surface S32 at a position that presses the damper tubular body 61_b_. The screw tilted surface S32 has an annular shape. The screw head 203_b_ has a shape in which the cross-sectional area of the screw head 203_b_ increases in a direction away from the columnar portion 203_a_. That is, the screw head 203_b_ having a conical shape is disposed at an end of the columnar portion 203_a_.

As will be described later, the screw head 203_b_ is a portion that deforms the damper tubular body 61_b_ from the first form to the second form. That is, the screw head 203_b_ is a portion that expands the diameter of the damper tubular body 61_b_. Thus, the screw head 203_b_ can be referred to as an expanding portion.

The damper 6_b_ includes an end corner surface S7 along the screw tilted surface S32. The end corner surface S7 is disposed between the first surface S1 and the inner circumferential surface S4. The end corner surface S7 is a surface that is pressed by the second screw 203 and deformed along the screw tilted surface S32. In this case, the end corner surface S7 can be regarded as a surface that is formed by a portion of the first surface S1 and a portion of the inner circumferential surface S4. The end corner surface S7 may be a surface provided in the damper tubular body 61_b_ in advance to be along the screw tilted surface S32. The end corner surface S7 is also referred to as an inner circumferential corner surface.

Here, a method of manufacturing the electronic controller 100 including the damper 6_b_ will be described with reference to FIG. 14. The covering step of the present embodiment is omitted because it is the same as that of the first embodiment.

In (a) the preparing step shown in FIG. 14, the circuit element 51 and the like are mounted on the insulating substrate 4*a*. The mounting method of the circuit element 51 is the same as that of the first embodiment.

In (b) the arranging step shown in FIG. 14, the damper 6*b* in the first form is arranged on the base 3*c*. In the arranging step, the second surface S2 is arranged to face the pedestal 34*c*. Further, in the arranging step, the base positioning portion 35*c* is inserted into the through hole H1.

In (c) the inserting step shown in FIG. 14, the damper 6*b* arranged on the base 3*c* is inserted into the second insertion hole 41*a*. At this time, as in the first embodiment, there is a sufficient gap between the outer circumferential surface S3 and the insertion hole surface S11. Thus, in the inserting step, the damper 6*b* can be easily inserted into the second insertion hole 41*a*.

In (d) the deforming step shown in FIG. 14, the second screw 203 is screwed into the second screw hole 32. In the deforming step, the second screw 203 is screwed into the second screw hole 32 while the screw tilted surface S32 is in contact with the end corner surface S7. At this time, in the damper 6*b*, force from the screw head 203*b* acts on the damper 6*b* not only in the thickness direction but also in the plane direction. Thus, in the damper 6*b*, the diameter of the damper tubular body 61*b* is expanded by the force applied from the screw head 203*b*. Thus, the first end surface S5 and the second end surface S6 of the damper 6*b* that are connected with the adhesive 7 are peeled off. Alternatively, in the damper 6*b*, the adhesive 7 may be divided. Further, since the force from the screw head 203*b* also acts on the damper 6*b* in the plane direction, the holding force for the insulating substrate 4*a* (circuit board 1) is improved.

As a result, the damper 6*b* is deformed from the first form to the second form. In other words, the diameter of the damper tubular body 61*b* is expanded by the force from the second screw 203. As described above, in the deforming step of the present embodiment, the damper 6*b* is changed from the first form to the second form with the force from the second screw 203 instead of using heat. Thus, in the assembly method of the present embodiment, the first form can be shifted to the second form simply by screwing the second screw 203. In this embodiment, the damper 6*a* or the damper 6*c* can be used instead of the damper 6*b*.

Sixth Modification

Figure 16:
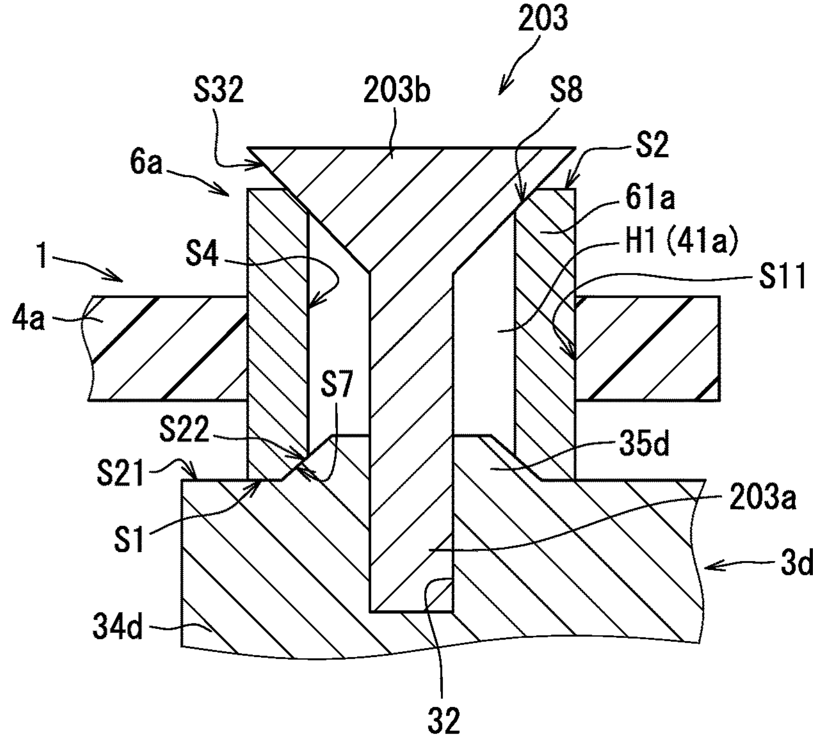
FIG. 16 is a cross-sectional view illustrating a schematic configuration of an electronic controller of a sixth modification.

With reference to FIG. 16, an electronic controller of a sixth modification will be described. In this modification, portions different from the third embodiment will be mainly described. In the electronic controller of this modification, the configuration of the base 3*d* is different from that of the third embodiment. In this modification, the damper 6*a* is adopted as an example. However, in this modification, the damper 6*b* can also be adopted.

In this modification, the damper 6*a* is disposed so that the second surface S2 is arranged to face the screw head 203*b* and the first surface 51 is arranged to face the base 3*c*. Thus, in this modification, an end corner surface S8 is a surface extending along the screw tilted surface S32.

As shown in FIG. 16, the base 3*d* includes a pedestal 34*d* and a base expanding portion 35*d*. The pedestal 34*d* is the same as the pedestal 34*c*. The base expanding portion 35*d* is a portion of the pedestal 34*d* that protrudes from the base pressing surface S21. The base expanding portion 35*d* has a truncated cone shape. The base expanding portion 35*d* has an annular base tilted surface S22. The base pressing surface S21 is in contact with the first surface 51. On the other hand, the base tilted surface S22 is in contact with the end corner surface S7 of the damper 6*a*. The end corner surface S7 will be described later.

Similar to the screw head 203*b*, the base expanding portion 35*d* can expand the diameter of the damper tubular body 61*d*. Further, the base expanding portion 35*d* also serves as a base positioning portion.

The damper 6*a* includes the end corner surface S7 close to the first surface 51 and the end corner surface S8 close to the second surface S2. The end corner surface S7 is a surface that is deformed along the base tilted surface S22 by a pressing force of the second screw 203. In this case, the end corner surface S7 can be regarded as a surface that is formed by a portion of the first surface S1 and a portion of the inner circumferential surface S4. The end corner surface S7 may be a surface provided in advance to extend along the base tilted surface S22. The end corner surface S8 is the same as the end corner surface S7 of the third embodiment. Each of the end corner surfaces S7 and S8 is also referred to as an inner circumferential corner surface.

In the deforming step of this modification, the second screw 203 is screwed into the second screw hole 32. In the deforming step, the second screw 203 is screwed into the second screw hole 32 while the screw tilted surface S32 is in contact with the end corner surface S8 and the base tilted surface S22 is in contact with the end corner surface S7. At this time, the damper 6*a* is changed from the first form to the second form in the same manner as in the third embodiment.

Thus, in the deforming step of this modification, similar effects to those of the third embodiment can be obtained. Further, the base 3*d* of this modification includes the base expanding portion 35*d*. Thus, force for expanding the diameter of the damper tubular body 61*a* is improved as compared with the third embodiment. Therefore, in the deforming step of this modification, the damper tubular body 61*a* can be shifted from the first form to the second form more easily than in the third embodiment. Further, the force to expand the diameter of the damper tubular body 61*a* is improved with the electronic controller of the sixth modification, thereby improving the holding force for the insulating substrate 4*a* (circuit board 1).

Fourth Embodiment

Figure 17:
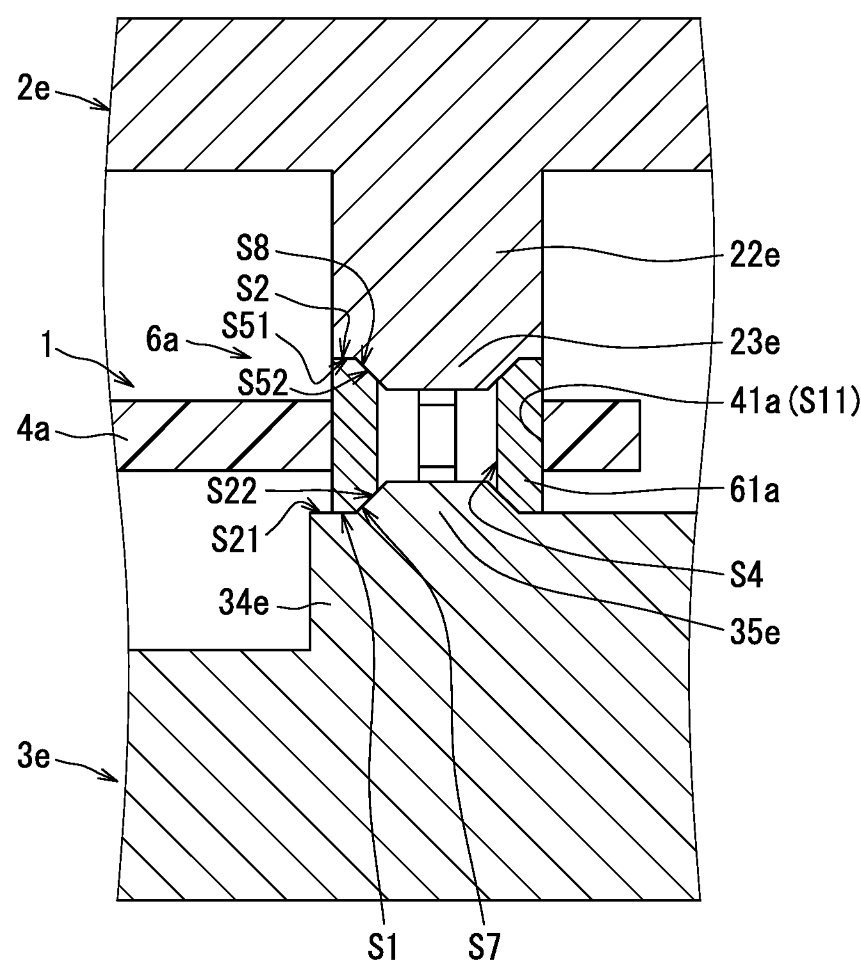
FIG. 17 is a cross-sectional view illustrating a schematic configuration of an electronic controller of a forth embodiment.

With reference to FIG. 17, an electronic controller 100 of a fourth embodiment will be described. In this embodiment, portions different from those in the first embodiment will be mainly described. In this embodiment, configurations of a cover 2*e* and a base 3*e* are different from those in the first embodiment.

As shown in FIG. 17, the electronic controller 100 includes the damper 6*a*, the cover 2*e* and the base 3*e* that configure a housing, and the insulating substrate 4*a*. The electronic controller 100 includes the circuit board 1 having the insulating substrate 4*a*, as in the first embodiment. The circuit board 1 corresponds to a supported portion.

As shown in FIG. 17, the cover 2*e* includes a cover protrusion 22*e* and a cover expanding portion 23*e*. The cover 2*e* corresponds to a holding member.

The cover protrusion 22*e* protrudes more than the periphery of the cover protrusion 22*e*. The cover protrusion 22*e* protrudes toward the housing space. The cover protrusion 22*e* has a tip end surface and the tip end surface includes the cover pressing surface S51 and the cover expanding portion 23*e*. The cover pressing surface S51 is a surface that is in contact with the second surface S2 of the damper 6*a* and that presses the damper 6*a*.

The cover expanding portion 23e is inserted into the through hole H1. The cover expanding portion 23e protrudes from the tip end surface of the cover protrusion 22e. The cover expanding portion 23e is a portion of the tip end surface of the cover protrusion 22e outside of the cover pressing surface S51. For example, the cover expanding portion 23e is located at a position surrounded by the cover pressing surface S51. The cover expanding portion 23e has the same configuration as the base expanding portion 35d. Thus, the cover expanding portion 23e has a cover tilted surface S52. The cover tilted surface S52 is in contact with the end corner surface S8 of the damper 6a and presses the damper 6a.

When the cover 2e is coupled to the base 3e, the cover 2e presses the damper 6a toward the base 3e between the cover 2e and the base 3e. The cover 2e and the base 3e hold the damper 6a while the cover 2e presses the damper 6a.

As shown in FIG. 17, the base 3e includes a pedestal 34e and a base expanding portion 35e. The base 3e corresponds to a supporting member. The pedestal 34e is the same as the pedestal 34d. The base expanding portion 35e is the same as the base expanding portion 35d. Thus, the pedestal 34e includes the base pressing surface S21 and the base tilted surface S22. The base expanding portion 35e is inserted into the through hole H1. The base pressing surface S21 is in contact with the first surface S1 of the damper 6a and presses the damper 6a. The base tilted surface S22 is in contact with the end corner surface S7 and presses the damper 6a.

Each of the cover expanding portion 23e and the base expanding portion 35e corresponds to a protrusion. In the present embodiment, an example in which the cover 2e includes the cover expanding portion 23e and the base 3e includes the base expanding portion 35e is adopted. However, the present disclosure is not limited to this. It is only required that at least one of the cover expanding portion 23e and the base expansion portion 35e be provided.

Each of the cover tilted surface S52 and the base tilted surface S22 corresponds to a tilted surface or an outer tilted surface. In the present embodiment, an example in which the cover 2e includes the cover tilted surface S52 and the base 3e includes the base tilted surface S22 is adopted. However, the present disclosure is not limited to this. It is only required that at least one of the cover tilted surface S52 and the base tilted surface S22 be provided.

As shown in FIG. 17, the damper 6a has the end corner surface S7 closer to the first surface S1 and the end corner surface S8 closer to the second surface S2. The end corner surface S7 is a surface that is pressed by the base 3e and deformed along the base tilted surface S22. In this case, the end corner surface S7 can be regarded as a surface that is formed by a portion of the first surface S1 and a portion of the inner circumferential surface S4. The end corner surface S8 is a surface that is pressed by the cover expanding portion 23e and deformed along the cover tilted surface S52. In this case, the end corner surface S8 can be regarded as a surface that is formed by a portion of the second surface S2 and a portion of the inner circumferential surface S4. Each of the end corner surfaces S7 and S8 corresponds to the inner circumferential corner surface.

In the electronic controller 100, the damper 6a is arranged in the second insertion hole 41a. The damper 6a is pressed by the cover 2e toward the base 3e while being arranged in the second insertion hole 41a. That is, the damper 6a is pressed toward the base 3e by coupling the cover 2e and the base 3e.

At this time, the cover expanding portion 23e and the base expanding portion 35e are inserted into the through hole H1 and fit to the damper 6a. That is, not only the first surface S1 and the second surface S2 of the damper 6a, but also the end corner surfaces S7 and S8 of the damper 6a are pressed. Thus, the force from the cover 2e and the base 3e acts on the damper 6a not only in the thickness direction but also in the plane direction. Therefore, the force applied to the damper 6a from the cover expanding portion 23e and the base expanding portion 35e expands the diameter of the damper tubular body 61a, so that the damper 6a is changed from the first form to the second form. Further, since the force from the cover 2e and the base 3e also acts on the damper 6a in the plane direction, the holding force for the insulating substrate 4a can be improved.

Then, in the damper 6a, the diameter of the damper tubular body 61a is expanded, and the damper tubular body 61a presses the insertion hole surface S11. That is, in the damper 6a, the damper tubular body 61a is pressed against the insertion hole surface S11. In this way, the damper 6a is held in the circuit board 1. The damper 6a relaxes stress to the circuit board 1 while being held in the circuit board 1. In this embodiment, the dampers 6b and 6c can be used instead of the damper 6a.

The damper 6a is elastically deformed in the thickness direction between the cover protrusion 22e and the pedestal 34e due to the stress applied in the thickness direction of the insulating substrate 4a. The upper portion and the lower portion of the damper 6a facing the insertion hole surface S11 are mainly elastically deformed. Thus, the damper 6a can protect the circuit board 1 when stress is applied to the insulating substrate 4a in the thickness direction.

Further, in the damper 6a, a space is defined in a region surrounded by the inner circumferential surface S4. Therefore, the damper 6a is easily elastically deformed in the intersecting direction. Therefore, the damper 6a can relax not only the stress to the circuit board 1 in the thickness direction but also stress to the circuit board 1 in the intersecting direction. Therefore, the damper 6a can appropriately relax the stress to the circuit board 1.

In the electronic controller 100, the cover expanding portion 23e and the base expanding portion 35e are fit to the damper 6a. Thus, in the electronic controller 100, the cover 2e and the base 3e are restricted from being displaced from the damper 6a. Therefore, the electronic controller 100 can protect the circuit board 1 from stress by appropriately pressing the damper 6a against the insertion hole surface S11 as compared with the case where the positions of the damper 6a, the cover 2e, and the base 3e are displaced.

Seventh Modification

Figure 18:
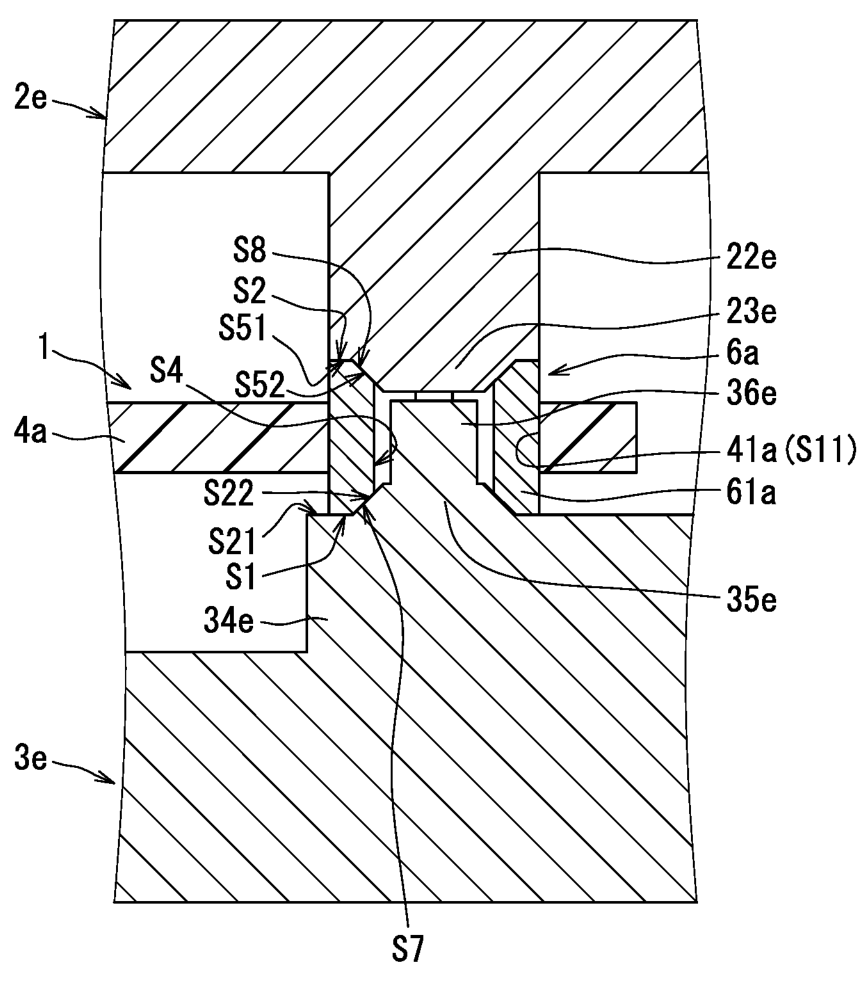
FIG. 18 is a cross-sectional view illustrating a schematic configuration of an electronic controller of a seventh modification.

With reference to FIG. 18, an electronic controller of a seventh modification will be described. In this modification, portions different from the fourth embodiment will be mainly described. In the electronic controller of this modification, the configuration of the base 3e is different from that of the fourth embodiment. However, in this modification, for convenience, the same reference numerals as those in the fourth embodiment are adopted.

As shown in FIG. 18, the base 3e includes a distance adjusting portion 36e. The distance adjusting portion 36e, like the distance adjusting portion 36b, restricts the inner circumferential surface S4 of the damper tubular body 61a from becoming too closer than necessary. The electronic controller 100 of the seventh modification can achieve similar effects to those of the fourth embodiment.

The orientations of the base tilted surface S22 of the base expanding portion 35e and the cover tilted surface S52 of the cover expanding portion 23_e_ may be appropriately changed as long as the holding force for the circuit board 1 can be improved. Similarly, as for the screw head 203_b_ shown in FIG. 16, the orientation of the screw tilted surface S32 may be appropriately changed as long as the holding force for the circuit board 1 can be improved.

Eighth Modification

Figure 19A:
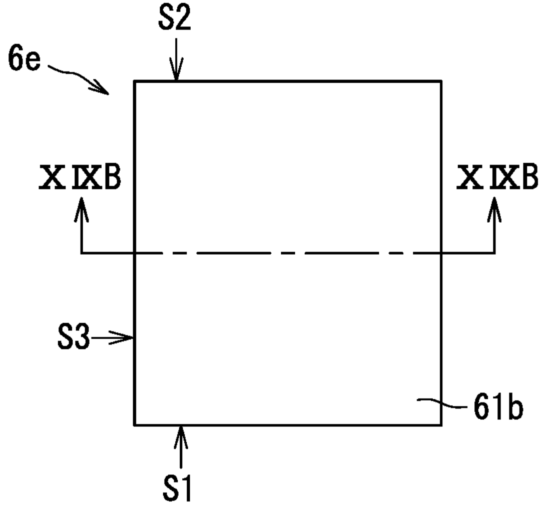
FIG. 19A is a diagram illustrating a schematic configuration of a damper of an eighth modification.
Figure 19B:
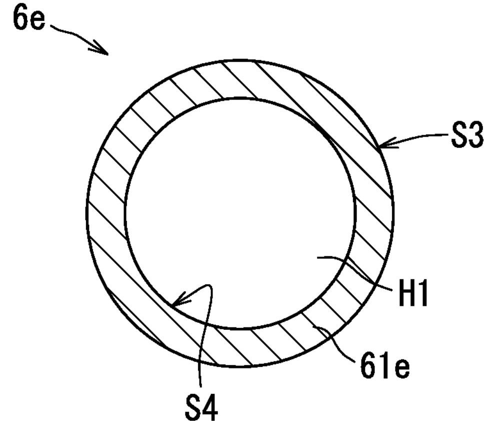
FIG. 19B is a cross-sectional view taken along a line XIXB-XIXB in FIG. 19A.

With reference to FIGS. 19A and 19B, a damper 6_e_ of the eighth modification will be described. FIG. 19A is a side view of the damper 6_e_. FIG. 19B is a cross-sectional view taken along a line XIXB-XIXB in FIG. 19A.

As shown in FIGS. 19A and 19B, the damper 6_e_ includes an annular damper tubular body 61_e_. The damper tubular body 61_e_ defines a through hole H1 like the damper tubular body 61_a_. Similar to the damper tubular body 61_a_, the damper tubular body 61_a_ includes the first surface S1, the second surface S2, the outer circumferential surface S3, and the inner circumferential surface S4. The damper tubular body 61_e_ may be made of a material same as that of the damper tubular body 61_a_. The damper 6_e_ is also referred to as a tubular member because the gap G1 is not defined. The damper tubular body 61_e_ corresponds to a tubular body.

The damper 6_e_ can also be applied to the third embodiment, the fourth embodiment, the sixth modification, and the seventh modification. As an example, a case where the damper 6_e_ is applied to the fourth embodiment will be described. The damper 6_e_ is arranged in the second insertion hole 41_a_. The damper 6_e_ is pressed by the cover 2_e_ toward the base 3_e_ while being arranged in the second insertion hole 41_a_. That is, the damper 6_e_ is pressed toward the base 3_e_ by coupling the cover 2_e_ and the base 3_e_.

At this time, the cover expanding portion 23_e_ and the base expanding portion 35_e_ are inserted into the through hole H1 and fit to the damper 6_e_. That is, not only the first surface S1 and the second surface S2 of the damper 6_e_, but also the end corner surfaces S7 and S8 of the damper 6_e_ are pressed. Thus, the force from the cover 2_e_ and the base 3_e_ acts on the damper 6_e_ not only in the thickness direction but also in the plane direction. Therefore, the force applied to the damper 6_e_ from the cover expanding portion 23_e_ and the base expanding portion 35_e_ expands the diameter of the damper tubular body 61_e_, so that the damper 6_e_ is changed from the first form to the second form. Further, since the force from the cover 2_e_ and the base 3_e_ also acts on the damper 6_a_ in the plane direction, the holding force for the insulating substrate 4_a_ can be improved.

Then, in the damper 6_e_, the diameter of the damper tubular body 61_e_ is expanded, so that the damper tubular body 61_e_ presses the insertion hole surface S11. That is, in the damper 6_e_, the damper tubular body 61_e_ is in contact with the insertion hole surface S11 with pressure. In this way, the damper 6_e_ is held in the circuit board 1. The damper 6_e_ relaxes stress to the circuit board 1 while being held in the circuit board 1. Therefore, the eighth modification can achieve similar effects to those of the fourth embodiment and the seventh modification.

Although the present disclosure has been described in accordance with the embodiments, it is understood that the present disclosure is not limited to such embodiments or structures. The present disclosure encompasses various modifications and variations within the scope of equivalents. In addition, while the various combinations and configurations are shown in this disclosure, other combinations and configurations, including more, less or only a single element, are also within the spirit and scope of the present disclosure.

What is claimed is:

1. An electronic controller comprising:

a damper;

a supporting member; and a supported member, wherein the damper is disposed in a holding hole that passes through, in a passing-through direction, the supported member, the damper comprising a tubular body defining therein a through hole that extends in the passing-through direction, wherein the tubular body is elastically deformable between a first form and a second form due to elastic force of the tubular body, the tubular body has a first outer diameter in the first form and a second outer diameter in the second form, the first outer diameter is less than an inner diameter of the holding hole, and the second outer diameter is larger than the inner diameter of the holding hole, the tubular body in the first form has an outer shape that is smaller than the holding hole, the tubular body in the second form has an outer shape that is greater than the outer shape in the first form and is in contact with the holding hole, the tubular body has a first end and a second end opposite to the first end in the passing-through direction, the tubular body defines a gap extending between the first end and the second end, and the gap is larger in the second form than in the first form, wherein the supporting member includes a base positioning portion and a distance adjusting portion that protrudes from an end surface of the base positioning portion, wherein the base positioning portion and the distance adjusting portion are housed in the through hole, the tubular body in the second form is disposed in the holding hole and presses an inner surface of the holding hole, and the supported member is supported by the supporting member through the damper.

2. The electronic controller according to claim 1, wherein the gap is filled with an adhesive when the tubular body is in the first form, and the adhesive is to be melted by heat.

3. The electronic controller according to claim 1 further comprising an adjusting member disposed in a space surrounded by the tubular body and configured to adjust a height of the tubular body, and the height of the tubular body is a length between a first end and a second end of the tubular body.

4. The electronic controller according to claim 1 further comprising a protrusion protruding from an outer circumferential surface of the tubular body.

5. The electronic controller according to claim 4, wherein the tubular body has a first end and a second end, the protrusion includes:

a first protrusion disposed closer to the first end than to the second end and protruding from the outer circumferential surface of the tubular body; and a second protrusion disposed closer to the second end than to the first end and protruding from the outer circumferential surface of the tubular body, the first protrusion and the second protrusion being located between the first end and the second end, and a distance between the first protrusion and the second protrusion is equal to or greater than a thickness of the supported member.

6. The electronic controller according to claim 1, wherein the tubular body is formed by weaving metal wires such that spaces are defined in the tubular body.

7. The electronic controller according to claim 1, wherein the tubular body is composed mainly of a shape memory alloy.

8. The electronic controller according to claim 2, wherein the gap in the second form is not entirely filled with the adhesive.

9. The electronic controller according to claim 1, wherein the tubular body consists of woven metal wires such that spaces are defined in the tubular body.

10. The electronic controller according to claim 6, wherein the tubular body includes a protecting member soaked into the spaces of the tubular body.

11. The electronic controller according to claim 10, wherein the protecting member is formed of an organic substance having viscoelasticity.

12. The electronic controller according to claim 1, wherein the tubular body consists of a shape memory alloy.

13. The electronic controller according to claim 4, wherein the protrusion radially protrudes only from a part of the first end of the tubular body.

14. The electronic controller according to claim 1, further comprising:

a cover having a cover protrusion and a cover positioning portion that protrudes from an end surface of the cover protrusion, the cover protrusion presses the damper against the supporting member, and the cover positioning portion is housed in the through hole.

15. The electronic controller according to claim 1, wherein the tubular body has an elliptical shape in the first form, and has a shape closer to a true circle than to the elliptical shape in the second form.

16. A method for coupling the damper of the electronic controller according to claim 2 to the supported member, the method comprising:

inserting the tubular body in the first form into the holding hole; and then melting the adhesive with heat to deform the tubular body from the first form to the second form, whereby the tubular body is pressed against an inner surface of the holding hole by restoring force.

17. The method according to claim 16, wherein the tubular body consists of woven metal wires such that spaces are defined in the tubular body, the tubular body includes a protecting member soaked into the spaces of the tubular body, and the method further comprising adjusting a compressibility of the damper to a desired value by adjusting a viscosity of the protecting member with ultraviolet rays.

18. The method according to claim 16, further comprising:

mounting the supported member on the base having the base positioning portion such that the base positioning portion is housed in the through hole, the base positioning portion protruding from the base in a thickness direction of the base; and fixing a cover having a cover protrusion to the base such that the cover protrusion presses the damper against the base, the cover protrusion protruding from the cover in a thickness direction of the cover, whereby the damper is pressed between the cover protrusion and the base.

* * * * *